United States Patent
Saito et al.

(10) Patent No.: US 7,271,429 B2
(45) Date of Patent: Sep. 18, 2007

(54) NITRIDE SEMICONDUCTOR DEVICE

(75) Inventors: Wataru Saito, Kanagawa (JP); Ichiro Omura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 11/109,858

(22) Filed: Apr. 20, 2005

(65) Prior Publication Data
US 2006/0043501 A1   Mar. 2, 2006

(30) Foreign Application Priority Data
Sep. 2, 2004   (JP) .............................. 2004-255467

(51) Int. Cl.
*H01L 29/739* (2006.01)
(52) U.S. Cl. ................ 257/197; 257/198; 257/E29.033
(58) Field of Classification Search ................ 257/197, 257/198
See application file for complete search history.

(56) References Cited

U.S. PATENT DOCUMENTS 6,555,851 B2   4/2003  Morizuka

2005/0110042 A1   5/2005  Saito et al.
2005/0189559 A1*  9/2005  Saito et al. .................. 257/189

FOREIGN PATENT DOCUMENTS

WO   WO2004068590   *  8/2004

OTHER PUBLICATIONS

Hu, et al., "IEE Electronics Letters", vol. 36, No. 8, pp. 753-754, (Apr. 13, 2000).
U.S. Appl. No. 11/149,208, filed Jun. 10, 2005, Saito, et al.
U.S. Appl. No. 10/634,917, filed Aug. 6, 2003, Saito et al.
U.S. Appl. No. 10/831,130, filed Apr. 26, 2004, Saito et al.
U.S. Appl. No. 11/507,598, filed Aug. 22, 2006, Saito, et al.

* cited by examiner

*Primary Examiner*—B. William Baumeister
*Assistant Examiner*—Matthew L. Reames
(74) *Attorney, Agent, or Firm*—Oblon, Spivak, McClelland, Maier & Neustadt, P.C.

(57) ABSTRACT

In a nitride semiconductor device according to one embodiment of the invention, a p-type gallium nitride (GaN) layer electrically connected to a source electrode and extending and projecting to a drain electrode side with respect to a gate electrode is formed on an undoped or n-type aluminum gallium nitride (AlGaN) layer serving as a barrier layer.

13 Claims, 18 Drawing Sheets

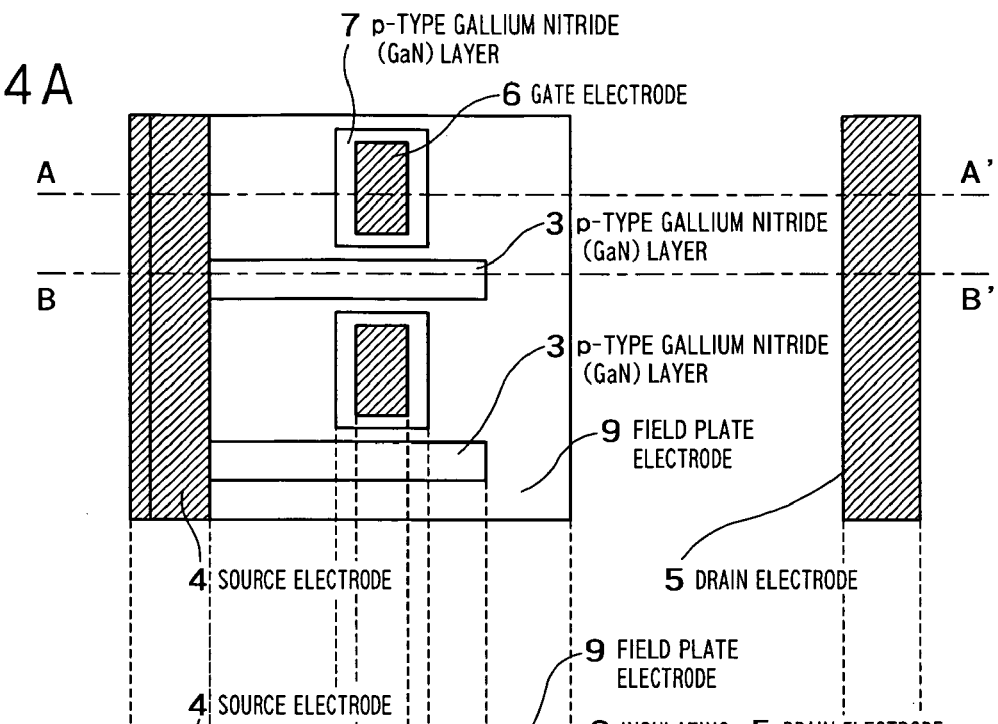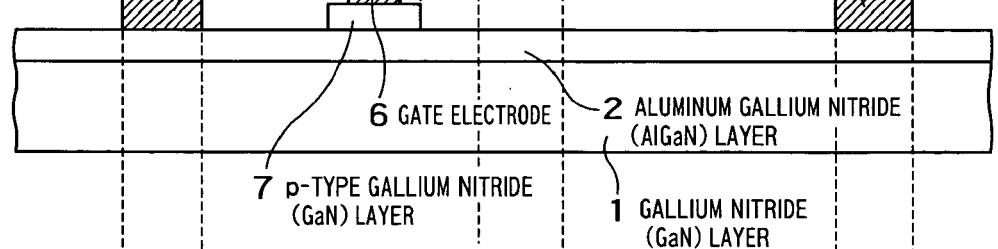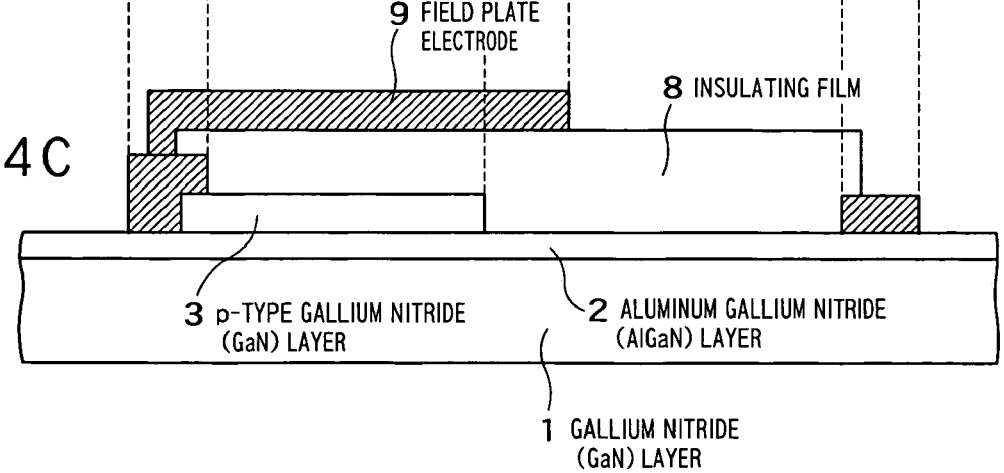

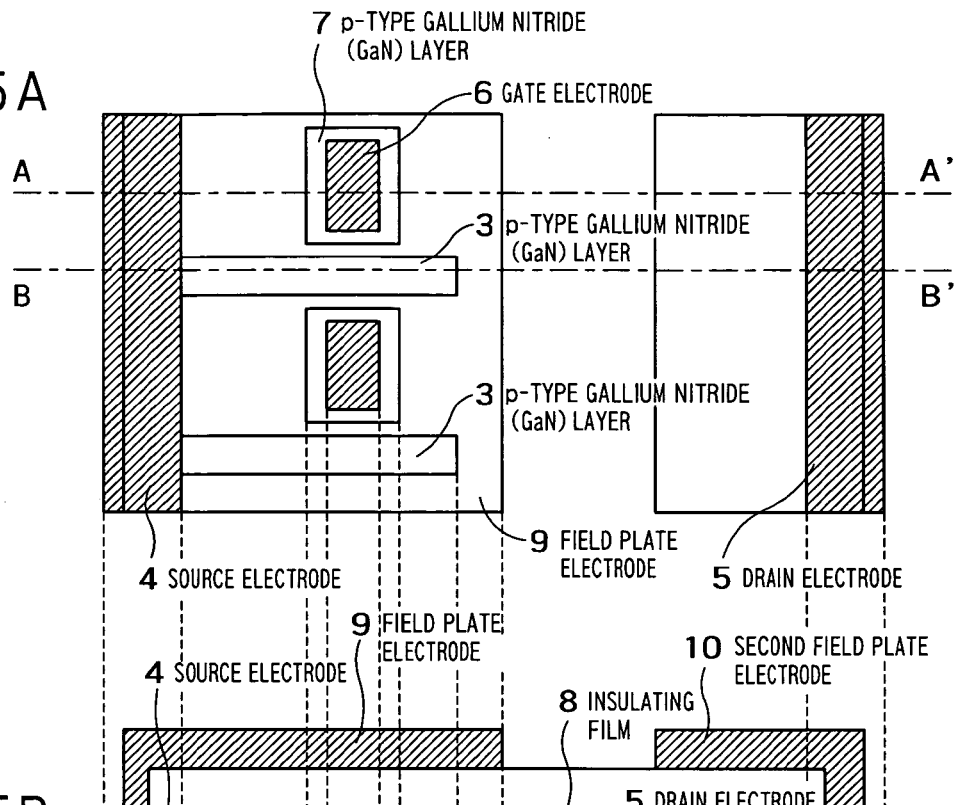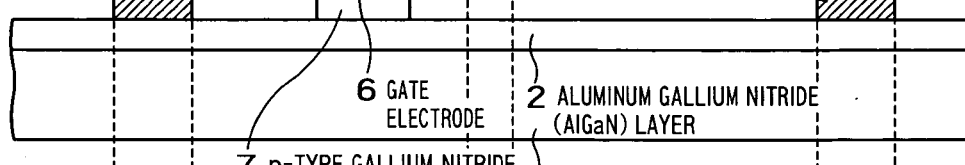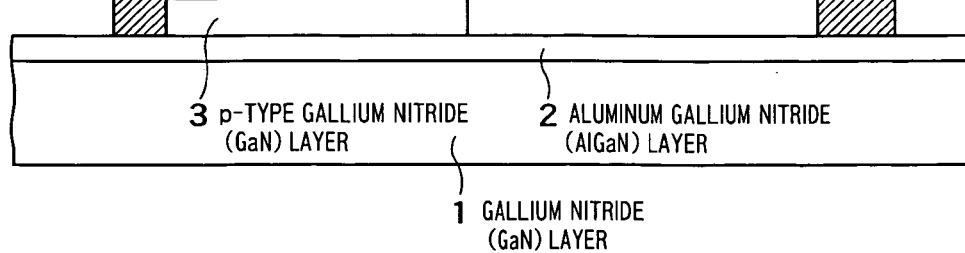

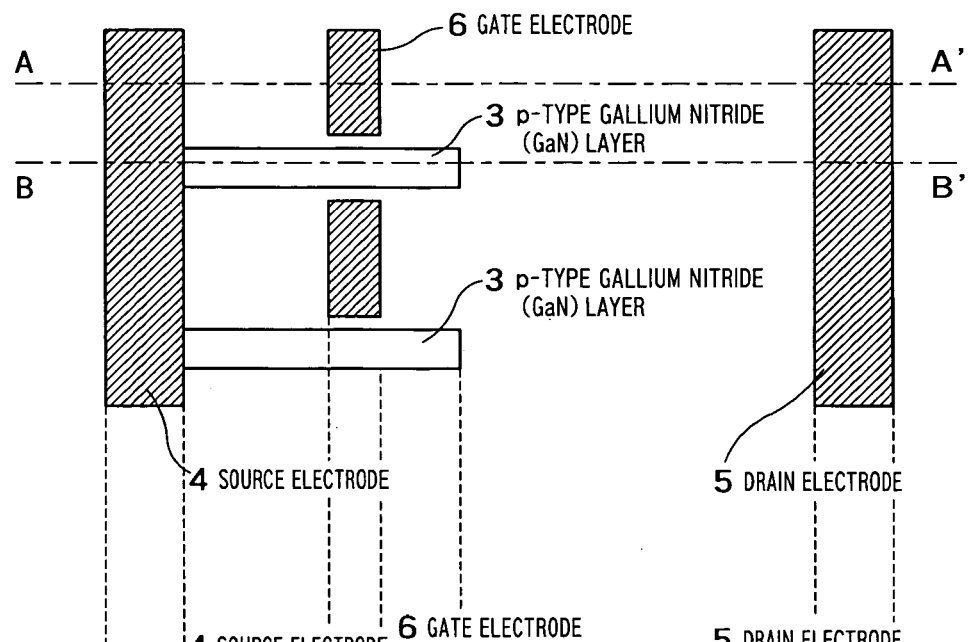
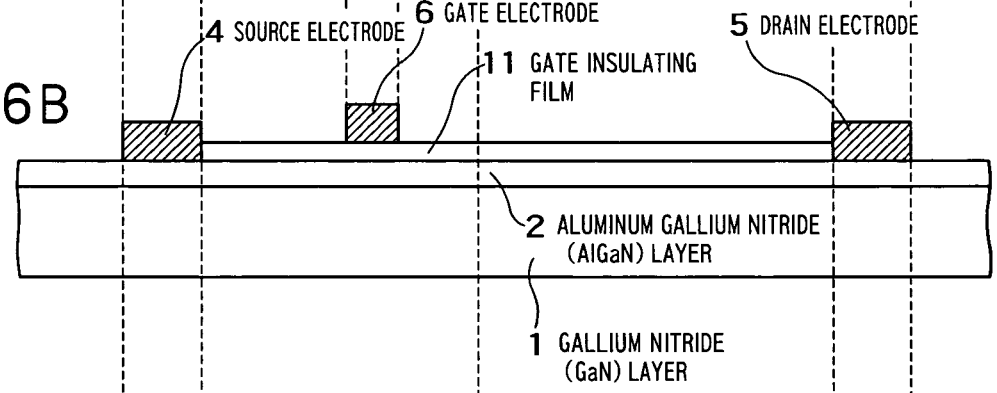
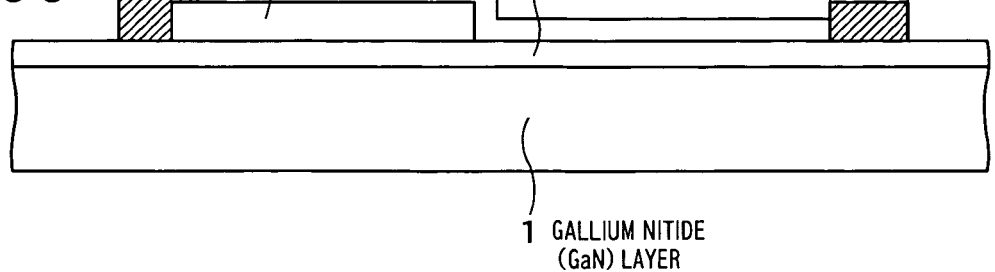

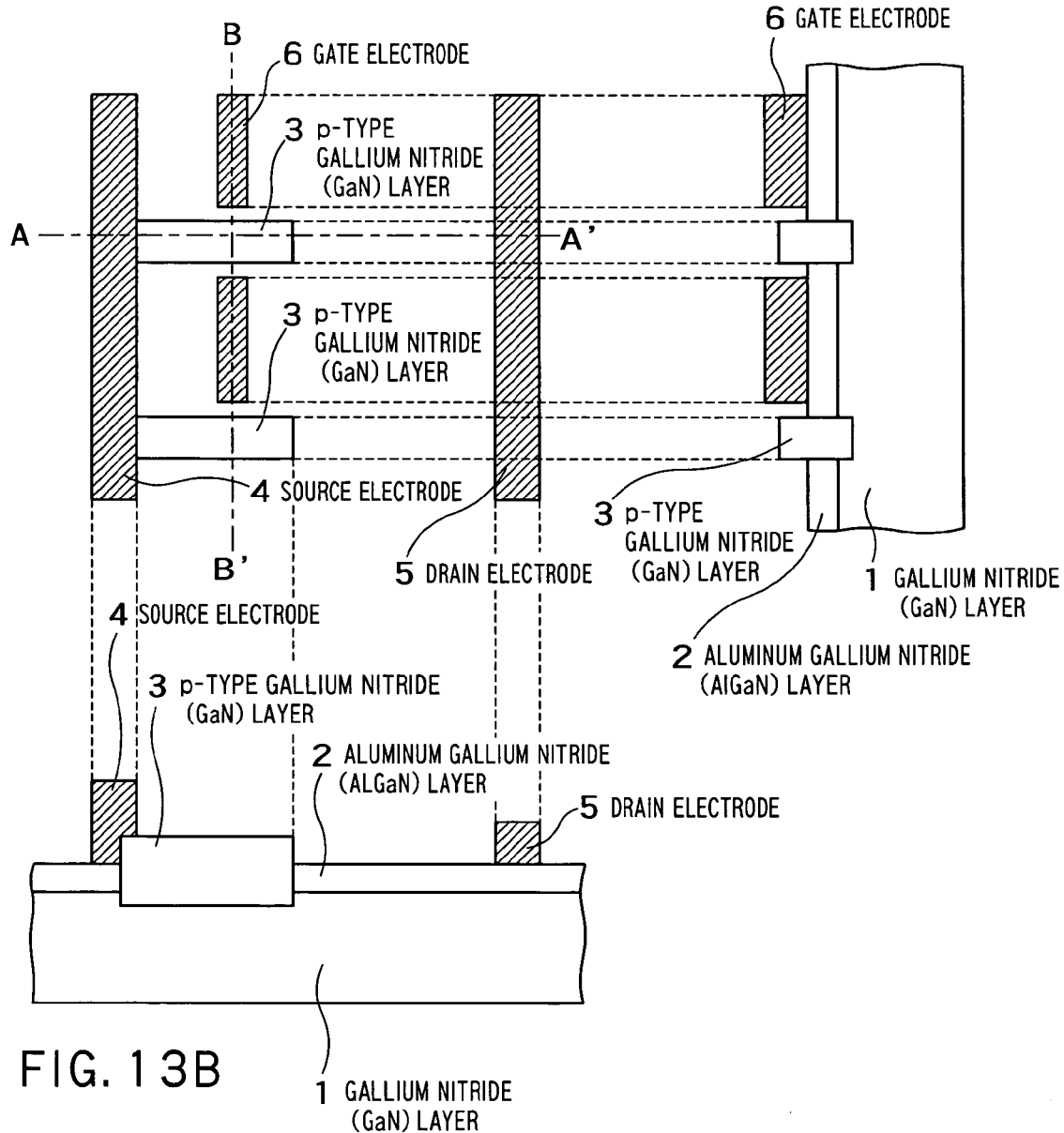

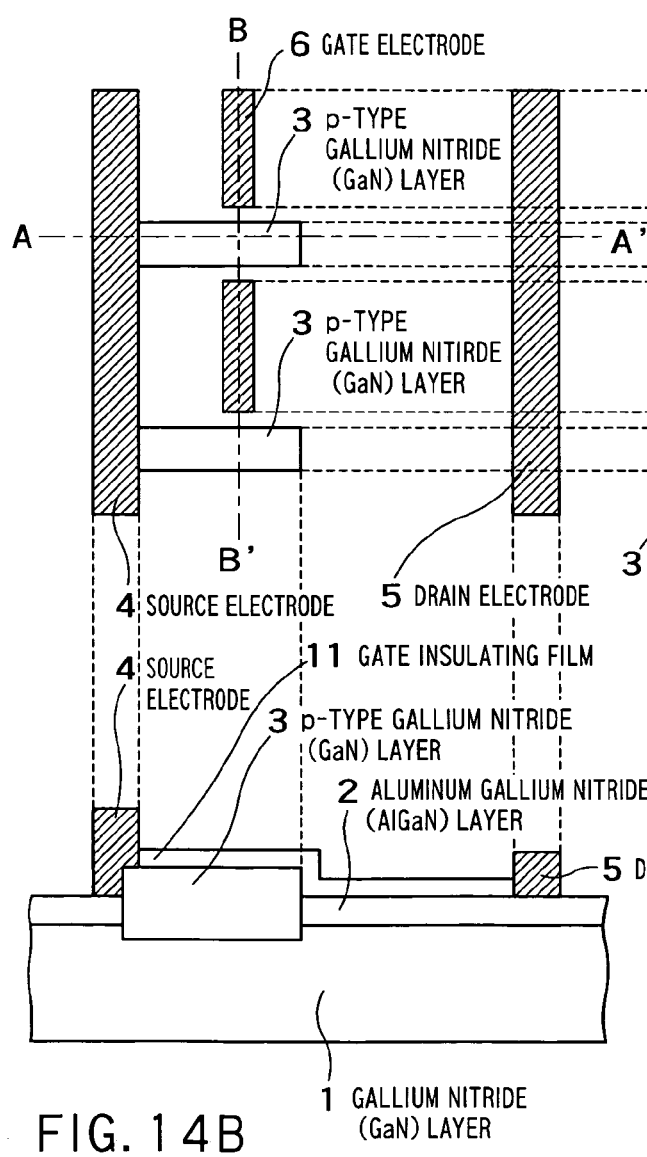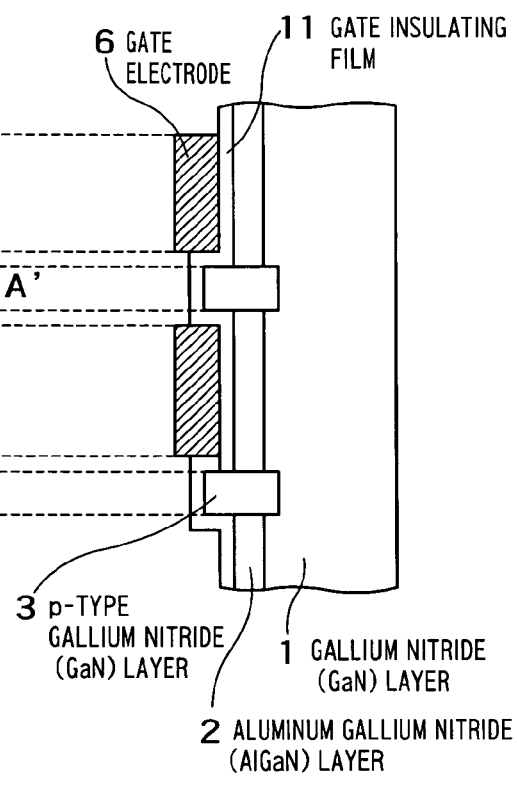

FIG. 15A
FIG. 15C
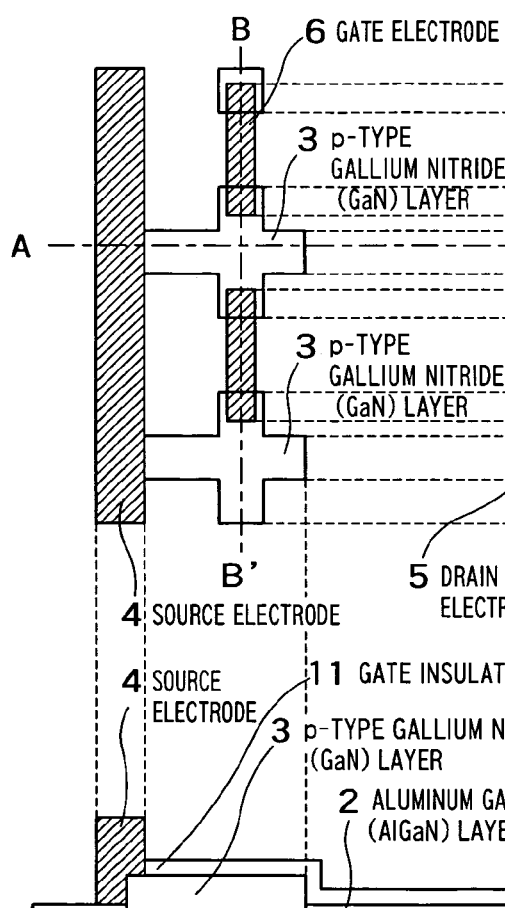
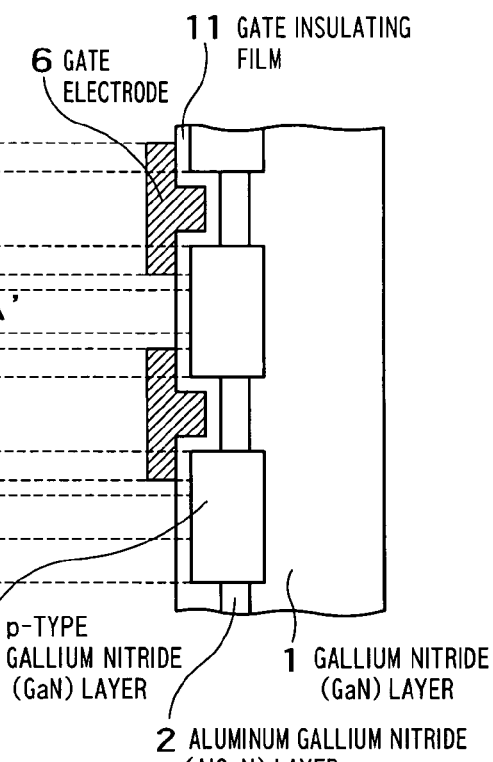
FIG. 15B

FIG. 17A
FIG. 17C
FIG. 17B
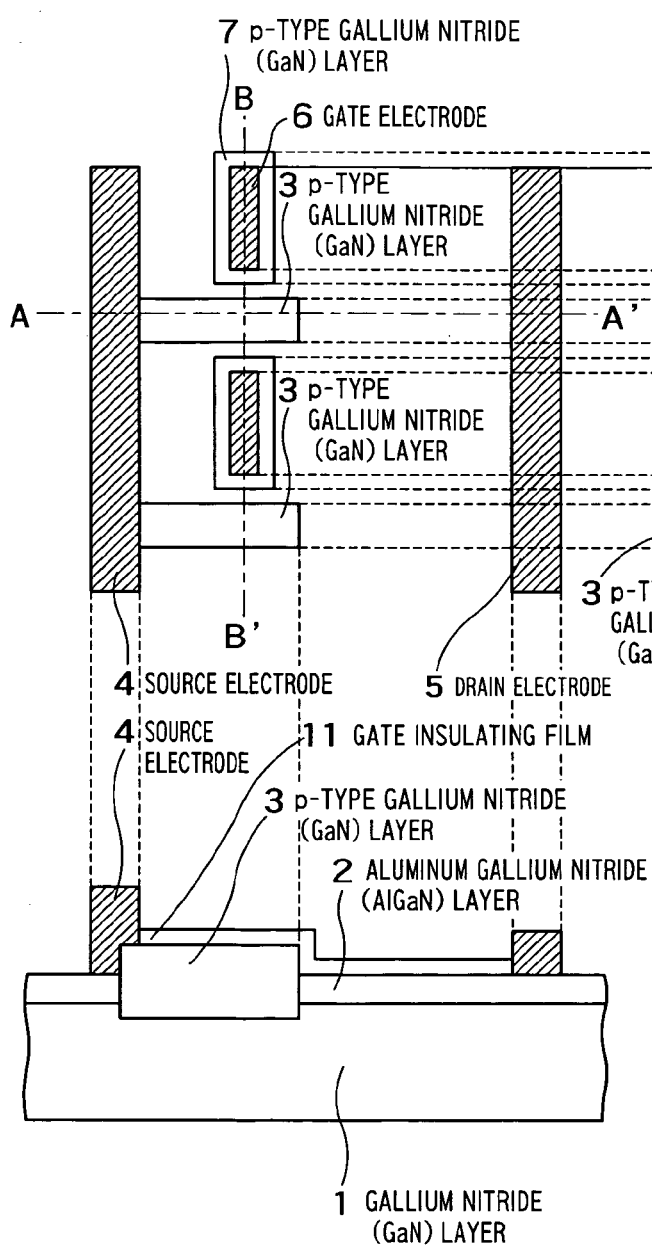
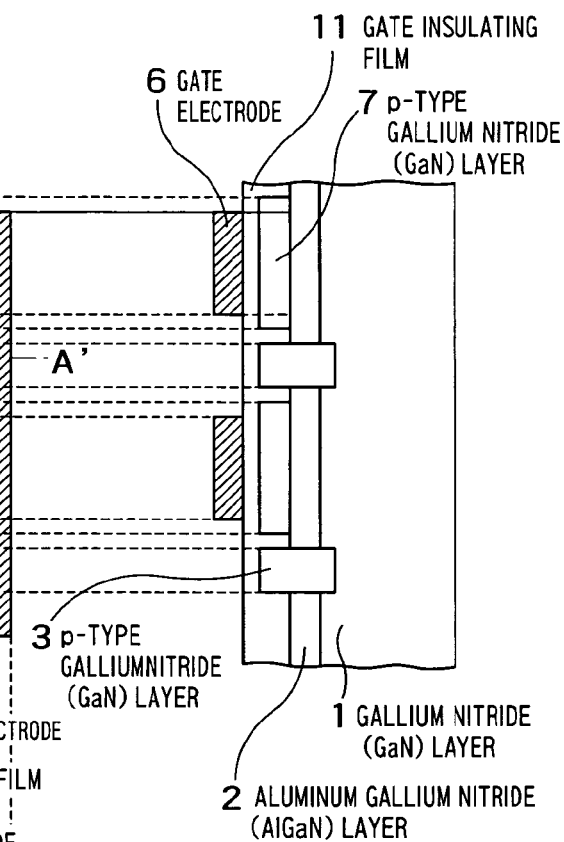

FIG. 19A
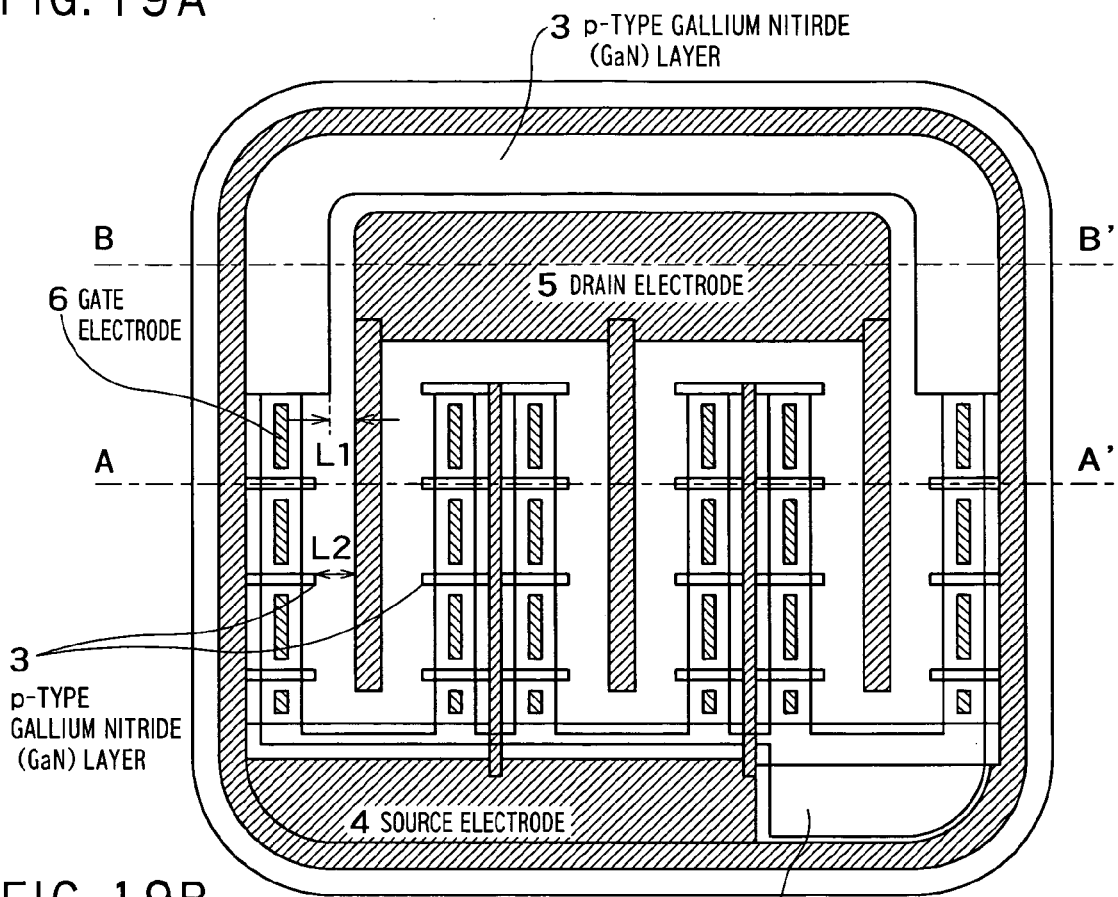
FIG. 19B
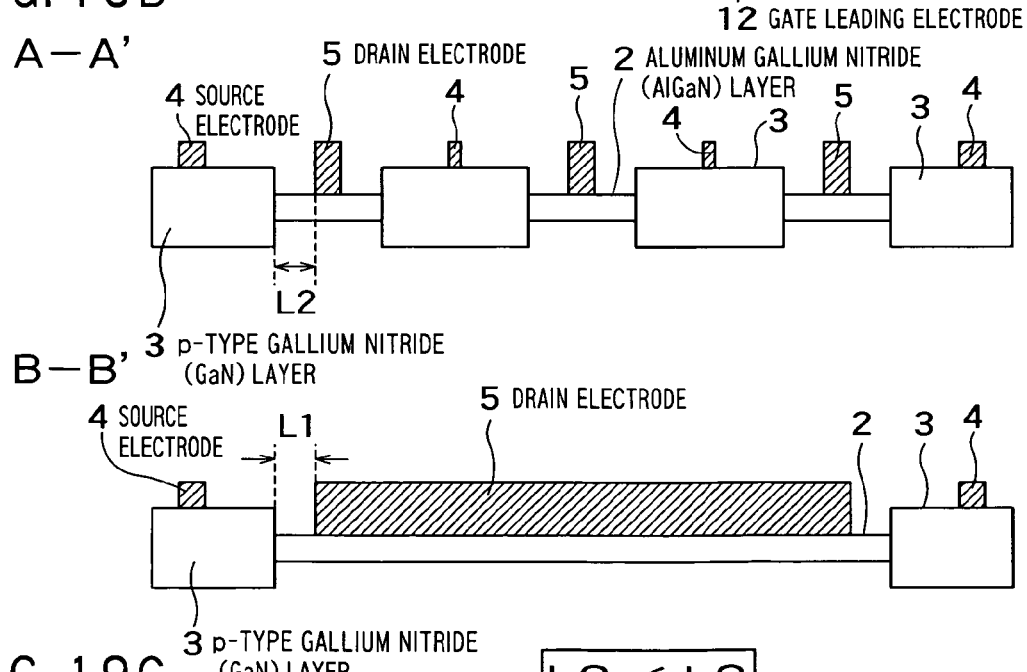
FIG. 19C
L2 < L2

NITRIDE SEMICONDUCTOR DEVICE

CROSS-REFERENCE TO RELATED APPLICATION

The subject application is related to subject matter disclosed in Japanese Patent Application No. 2004-255467 filed on Sep. 2, 2004 in Japan to which the subject application claims priority under Paris Convention and which is incorporated herein by reference.

BACKGROUND OF THE INVENTION

1. Field of the Invention

The present invention relates to a nitride semiconductor device used in electric power control and, more particularly, to a horizontal nitride power FET.

2. Related Background Art

A power semiconductor device such as a switching device or a diode used for power control is used in a circuit for a switching power supply, an inverter, or the like, and such power semiconductor device is required to have a high breakdown voltage and a low ON-resistance.

There is a trade-off between the breakdown voltage and the ON-resistance of the semiconductor device, depending on device material.

In a power semiconductor device using silicon as a general device material, a marginal low ON-resistance has been realized by the progress of engineering development up to now.

Therefore, in order to further reduce the ON-resistance of a power semiconductor device, a device material must be changed, a wide-band gap semiconductor including a nitride semiconductor such as gallium nitride (GaN), aluminum gallium nitride (AlGaN), or silicon carbide (SiC) is used as a switching device material to make it possible to improve the trade-off determined by a material, and an ON-resistance of the device can be dramatically made low.

At the present, the study of a power semiconductor device using a wide band gap semiconductor is actively performed. Though a nitride semiconductor device such as gallium nitride (GaN) realizes a low ON-resistance, it is not designed in consideration of the characteristics of a power semiconductor device such as an avalanche withstanding capability. This is because a gallium nitride (GaN) based device is designed on the basis of a communication device.

Some semiconductor devices using gallium nitride (GaN) as a device material have been proposed and publicly known. For example, see Japanese Patent Application Laid-Open No. 2001-168111.

SUMMARY OF THE INVENTION

According to one embodiment of the present invention, there is provided a nitride semiconductor device comprising:

an undoped first aluminum gallium nitride ($Al_xGa_{1-x}N$ ($0 \leq x \leq 1$)) layer as a channel layer;

an undoped or n-type second aluminum gallium nitride ($Al_yGa_{1-y}N$ ($0 \leq y \leq 1$, x<y)) layer formed as a barrier layer on the first aluminum gallium nitride layer;

a p-type third aluminum gallium nitride ($Al_zGa_{1-z}N$ ($0 \leq z \leq 1$)) layer having stripe-shaped portions formed at predetermined intervals in a predetermined region on the second aluminum gallium nitride layer;

a source electrode formed on the second aluminum gallium nitride layer to electrically connected to one ends of the stripe-shaped portions of the third aluminum gallium nitride layer;

a drain electrode formed on the second aluminum gallium nitride layer to be spaced apart form the other ends of the stripe-shaped portions of the third aluminum gallium nitride layer; and a gate electrode formed on the second aluminum gallium nitride layer between the source electrode and the drain electrode in a side of the source electrode with respect to the other ends of the stripe-shaped portions of the third aluminum gallium nitride layer.

According to another embodiment of the present invention, there is provided a nitride semiconductor device comprising:

an undoped first aluminum gallium nitride ($Al_xGa_{1-x}N$ ($0 \leq x \leq 1$)) layer as a channel layer;

an undoped or n-type second aluminum gallium nitride ($Al_yGa_{1-y}N$ ($0 \leq y \leq 1$, x<y)) layer formed as a barrier layer on the first aluminum gallium nitride layer;

a p-type third aluminum gallium nitride ($Al_zGa_{1-z}N$ ($0 \leq z \leq 1$)) layer having portions formed in stripe-shaped recess portions formed at predetermined intervals in a depth corresponding to a level difference between the surface of the second aluminum gallium nitride layer and the surface portion of the first aluminum gallium nitride layer in a predetermined region on the second aluminum gallium nitride layer to project over the second aluminum gallium nitride layer;

a source electrode formed on the second aluminum gallium nitride layer to electrically connected to one ends of the stripe-shaped portions of the third aluminum gallium nitride layer formed in the recess portions;

a drain electrode formed on the second aluminum gallium nitride layer to be spaced apart form the other ends of the stripe-shaped portions of the third aluminum gallium nitride layer; and a gate electrode formed on the second aluminum gallium nitride layer between the source electrode and the drain electrode in a side of the source electrode with respect to the other ends of the stripe-shaped portions of the third aluminum gallium nitride layer.

BRIEF DESCRIPTION OF THE DRAWINGS

FIG. 4A is a plan view typically showing the configuration of a nitride power semiconductor device according to a third embodiment of the present invention, and FIGS. 4B and 4C are sectional views typically showing the configuration of the same;

FIG. 5A is a plan view typically showing the configuration of a nitride power semiconductor device according to a fourth embodiment of the present invention, and FIGS. 5B and 5C are sectional views typically showing the configuration of the same;

FIG. 6A is a plan view typically showing the configuration of a nitride power semiconductor device according to a fifth embodiment of the present invention, and FIGS. 6B and 6C are sectional views typically showing the configuration of the same;

FIG. 13A is a plan view typically showing the configuration of a nitride power semiconductor device according to a tenth embodiment of the present invention, and FIGS. 13B and 13C are sectional views typically showing the configuration of the same;

FIG. 14A is a plan view typically showing the configuration of a nitride power semiconductor device according to an eleventh embodiment of the present invention, and FIGS. 14B and 14C are sectional views typically showing the configuration of the same;

FIG. 15A is a plan view typically showing the configuration of a nitride power semiconductor device according to a twelfth embodiment of the present invention, and FIGS. 15B and 15C are sectional views typically showing the configuration of the same;

FIG. 17A is a plan view typically showing the configuration of a nitride power semiconductor device according to a fourteenth embodiment of the present invention, and FIGS. 17B and 17C are sectional views typically showing the configuration of the same;

FIG. 19A is a plan view typically showing the configuration of a nitride power semiconductor device according to a sixteenth embodiment of the present invention, and FIGS. 19B and 19C are sectional views typically showing the configuration of the same.

DETAILED DESCRIPTION OF THE EMBODIMENTS

Figure 1A:
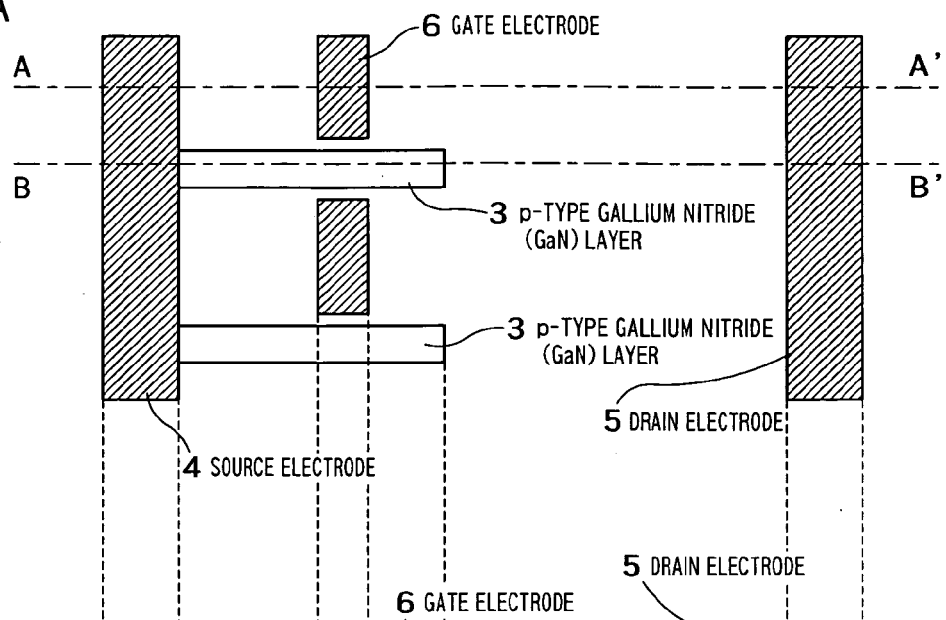
FIG. 1A is a plan view typically showing the configuration of a nitride power semiconductor device according to a first embodiment of the present invention.

Embodiments of the present invention will be described below with reference to the accompanying drawings. The same reference numerals as in the drawings denote the same parts.

Figure 1B:
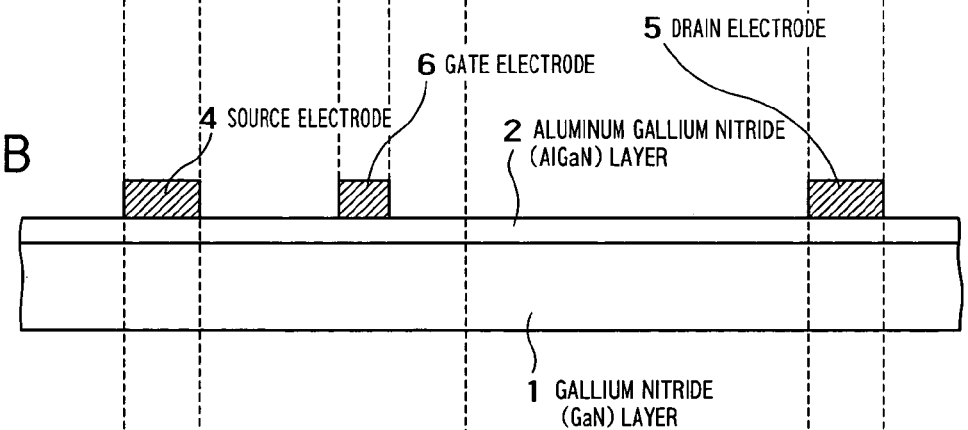
FIGS. 1B and 1C are sectional views typically showing the configuration of the same.
Figure 1C:
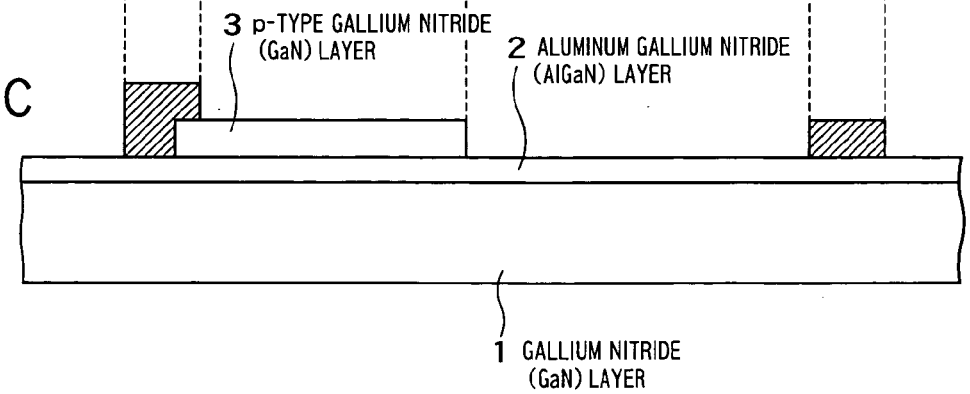

FIG. 1A is a plan view typically showing the configuration of a nitride power semiconductor device according to the first embodiment of the present invention. FIGS. 1B and 1C are sectional views typically showing the configuration of the same. FIGS. 1B and 1C show sectional structures along lines A-A' and B-B' shown in FIG. 1A, respectively.

The nitride power semiconductor device according to the first embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, stripe-shaped p-type gallium nitride (GaN) layers 3 formed in substantially parallel to each other at predetermined intervals in a predetermined region on the n-type aluminum gallium nitride (AlGaN) layer 2, a source electrode 4 formed on the n-type aluminum gallium nitride (AlGaN) layer 2 to be electrically connected to one ends of the p-type gallium nitride (GaN) layers 3, a drain electrode 5 formed on the n-type aluminum gallium nitride (AlGaN) layer 2 and spaced apart from the other ends of the p-type gallium nitride (GaN) layers 3, and a gate electrode 6 formed on the n-type aluminum gallium nitride (AlGaN) layer 2 between the source electrode 4 and the drain electrode 5 in the side of the source electrode 4 with respect to the other ends of the p-type gallium nitride (GaN) layers 3.

The gallium nitride (GaN) layer 1 is formed as a first aluminum gallium nitride ($Al_xGa_{1-x}N$ ($0 \leq x \leq 1$)) layer. The n-type aluminum gallium nitride (AlGaN) layer 2 is formed as a second aluminum gallium nitride ($Al_yGa_{1-y}N$ ($0 \leq y \leq 1$, $x<y$)) layer.

As is apparent from the structures, the nitride power semiconductor device according to the first embodiment of the present invention is a horizontal gallium-nitride based high electron mobility transistor (HEMT) including an aluminum gallium nitride/gallium nitride (AlGaN/GaN) heterostructure.

The p-type gallium nitride (GaN) layers 3 are formed as a third aluminum gallium nitride ($Al_zGa_{1-z}N$ ($0 \leq z \leq 1$)) layer, and is a constituent element which are not included in a conventional HEMT structure.

In the conventional HEMT structure, the p-type gallium nitride (GaN) layers 3 are not formed. For this reason, when a high voltage is applied to the drain electrode 5, avalanche breakdown occurs at the end portion of the gate electrode 6 or the end portion of the drain electrode 5. Holes generated at this time are not rapidly discharged from the gate electrode 6 due to the presence of the n-type aluminum gallium nitride (AlGaN) layer 2, and are accumulated in the gallium nitride (GaN) layer 1 serving as a channel layer. Accordingly, an electric field in the gallium nitride (GaN) layer 1 further increases to increase an avalanche breakdown current, thereby breaking the device. More specifically, the conventional HEMT structure has a low avalanche withstanding capability.

On the other hand, in the nitride power semiconductor device according to the first embodiment of the present invention, the p-type gallium nitride (GaN) layers 3 electrically connected to the source electrode 4 and extending and projecting to the side of the drain electrode 5 with respect to the gate electrode 6 are formed on the n-type aluminum gallium nitride (AlGaN) layer 2. For this reason, when a high voltage is applied to the drain electrode 5, avalanche breakdown occurs in a pn junction formed between the p-type gallium nitride (GaN) layers 3 and the n-type aluminum gallium nitride (AlGaN) layer 2. Therefore, generated holes are rapidly discharged to the source electrode 4 through the p-type gallium nitride (GaN) layers 3. More specifically, the p-type gallium nitride (GaN) layers 3 serve as a loophole to have a lightning conductor function. Accordingly, the holes are not accumulated in the gallium nitride (GaN) layer 1 serving as a channel layer to make it possible to realize a high avalanche withstanding capability.

Even though the n-type aluminum gallium nitride (AlGaN) layer 2 is formed as an undoped layer but an n-type layer, the embodiment can be realized.

The p-type gallium nitride (GaN) layer 3, as described above, is formed as a third aluminum gallium nitride ($Al_zGa_{1-z}N$ ($0 \leq z \leq 1$)) layer. Accordingly, even though a p-type aluminum gallium nitride (AlGaN) layer is formed but a p-type gallium nitride (GaN) layer as the p-type gallium nitride (GaN) layer 3, the embodiment can also be realized.

In this embodiment, the p-type gallium nitride (GaN) layers 3 are formed in substantially parallel to each other at the predetermined intervals in the predetermined region. However, the "predetermined intervals" may not be constant intervals, and the layers may not always be formed in substantially parallel to each other.

Furthermore, the horizontal sectional shape of the p-type gallium nitride (GaN) layers 3 is arbitrary. However, as in this embodiment and other embodiments to be described later, when the p-type gallium nitride (GaN) layers 3 have shape including stripe-shaped portions, the desired effects can be easily obtained.

Figure 2A:
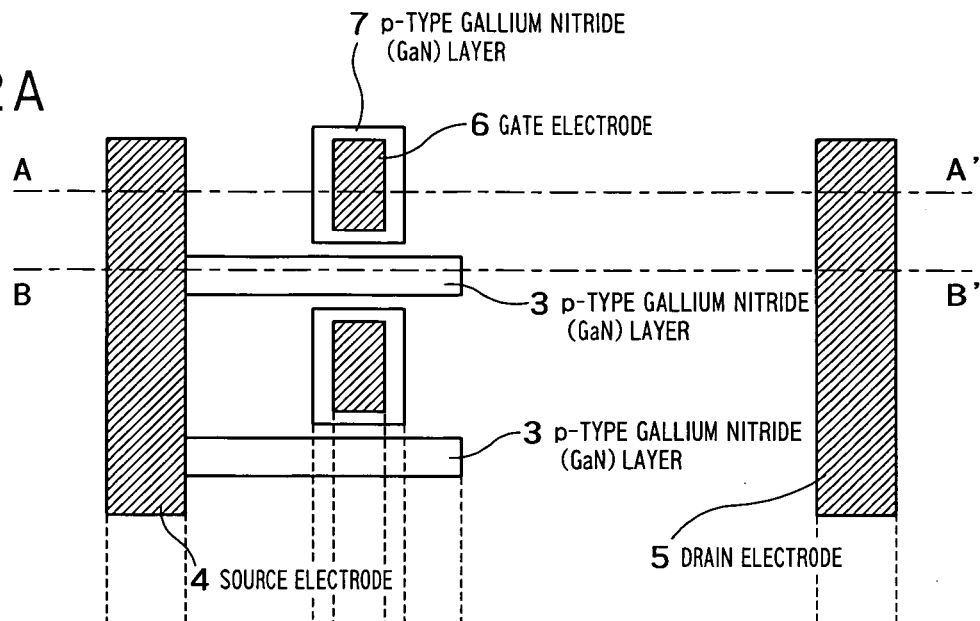
FIG. 2A is a plan view typically showing the configuration of a nitride power semiconductor device according to a second embodiment of the present invention.
Figure 2B:
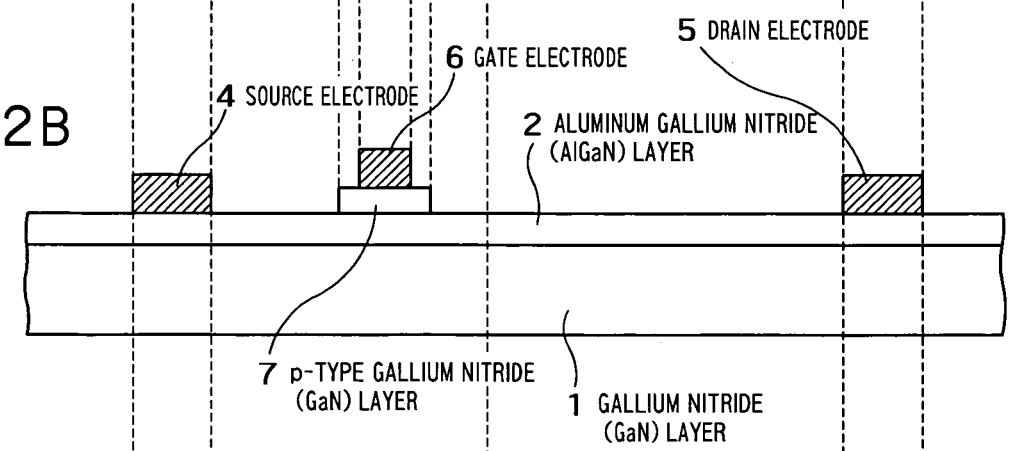
FIGS. 2B and 2C are sectional views typically showing the configuration of the same.
Figure 2C:
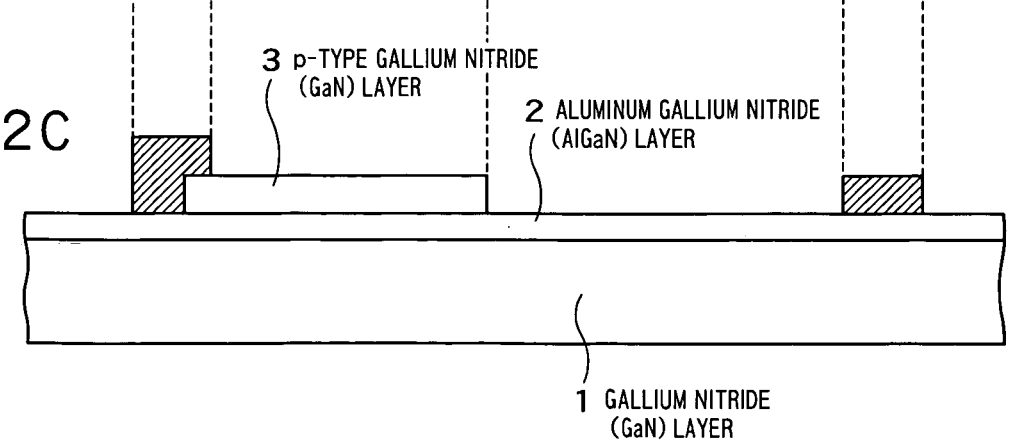

FIG. 2A is a plan view typically showing the configuration of a nitride power semiconductor device according to the second embodiment of the present invention. FIGS. 2B and 2C are sectional views typically showing the configuration of the same. FIGS. 2B and 2C show sectional structures along lines A-A' and B-B' shown in FIG. 2A, respectively.

The nitride power semiconductor device according to the second embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, stripe-shaped p-type gallium nitride (GaN) layers 3 formed in substantially parallel to each other at predetermined intervals in a predetermined region on the n-type aluminum gallium nitride (AlGaN) layer 2, a source electrode 4 formed on the n-type aluminum gallium nitride (AlGaN) layer 2 to be electrically connected to one ends of the p-type gallium nitride (GaN) layers 3, a drain electrode 5 formed on the n-type aluminum gallium nitride (AlGaN) layer 2 and spaced apart from the other ends of the p-type gallium nitride (GaN) layers 3, a p-type gallium nitride (GaN) layer 7 formed on the n-type aluminum gallium nitride (AlGaN) layer 2 between the source electrode 4 and the drain electrode 5 in the side of the source electrode 4 with respect to the other ends of the p-type gallium nitride (GaN) layers 3, and a gate electrode 6 formed on the p-type gallium nitride (GaN) layer 7.

More specifically, the nitride power semiconductor device according to the second embodiment of the present invention is obtained by additionally forming the p-type gallium nitride (GaN) layer 7 on the n-type aluminum gallium nitride (AlGaN) layer 2 formed immediately under the gate electrode 6 in the nitride power semiconductor device according to the first embodiment of the present invention. In other words, the p-type gallium nitride (GaN) layer 7 is formed to be sandwiched between the n-type aluminum gallium nitride (AlGaN) layer 2 and the gate electrode 6.

The p-type gallium nitride (GaN) layer 7 is formed to deplete a channel immediately under the p-type gallium nitride (GaN) layer 7 when no voltage is applied to the gate electrode 6 to make it possible to realize a normally-off state.

In a conventionally normally-off type HEMT structure in which no p-type gallium nitride (GaN) layers 3 are formed, when avalanche breakdown occurs, holes flow into the gate electrode 6 through the p-type gallium nitride (GaN) layer 7. Therefore, a gate driver circuit is disadvantageously broken even if the device is not broken in the avalanche breakdown.

On the other hand, as in the nitride power semiconductor device according to the second embodiment, in a normally-off type HEMT structure in which the p-type gallium nitride (GaN) layer 7 is formed immediately under the gate electrode 6, the p-type gallium nitride (GaN) layers 3 electrically connected to the source electrode 4 and extending and projecting to the side of the drain electrode 5 with respect to the gate electrode 6 are formed on the n-type aluminum gallium nitride (AlGaN) layer 2, so that a gate driver circuit can be avoided from being loaded in avalanche breakdown to make it possible to realize a high avalanche withstanding capability.

The p-type gallium nitride (GaN) layers 3 and the p-type gallium nitride (GaN) layer 7 can be simultaneously formed such that crystal growth of a p-type gallium nitride (GaN) layer is performed on the n-type aluminum gallium nitride (AlGaN) layer 2 and then patterned by etching.

Figure 3:
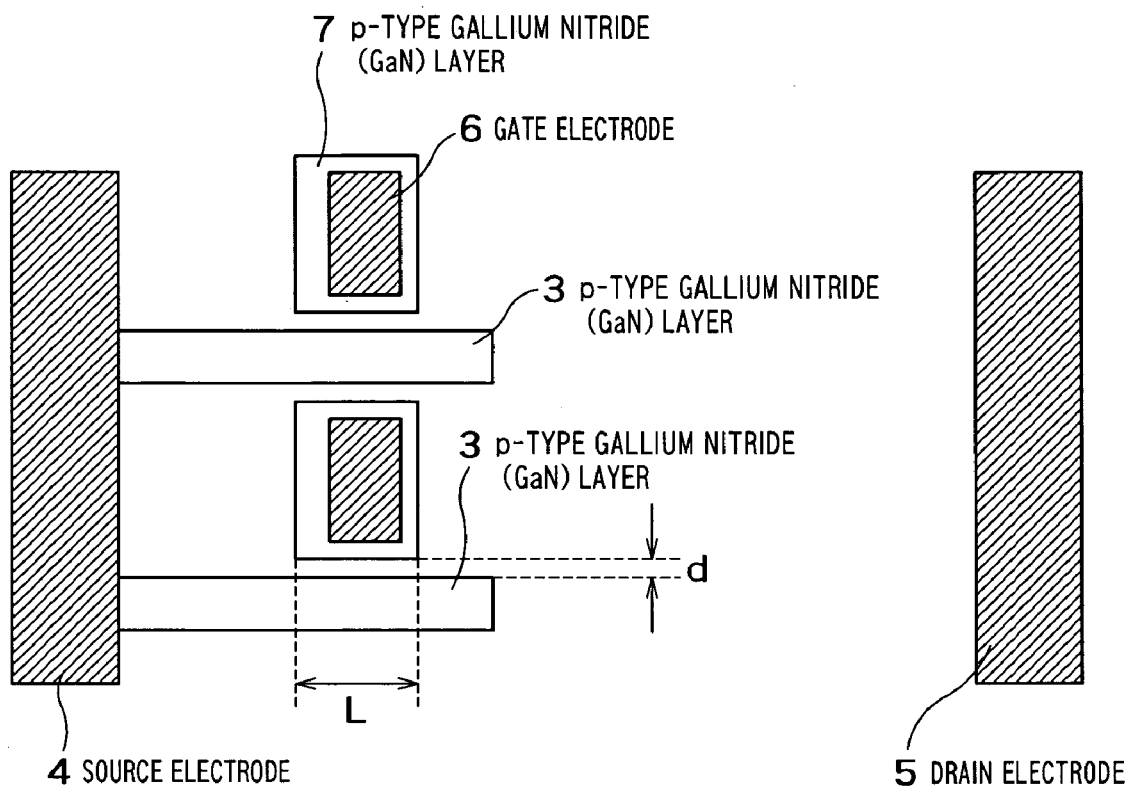
FIG. 3 is a plan view showing an interval d between the p-type gallium nitride layer 3 and the p-type gallium nitride layer 7 and a length (channel length) L of the p-type gallium nitride layer 7 in the nitride power semiconductor device according to the second embodiment of the present invention.

FIG. 3 is a plan view showing an interval d between the p-type gallium nitride layer 3 and the p-type gallium nitride layer 7 and a length (channel length) L of the p-type gallium nitride layer 7 in the nitride power semiconductor device according to the second embodiment of the present invention.

As shown in FIG. 3, the interval d between the p-type gallium nitride (GaN) layer 3 and the p-type gallium nitride (GaN) layer 7 is a distance therebetween. The length, i.e., the channel length L is the dimension of the p-type gallium nitride (GaN) layer 7 in a direction extending from the source electrode 4 to the drain electrode.

In the nitride power semiconductor device according to the second embodiment of the present invention, the interval d between the p-type gallium nitride (GaN) layer 3 and the p-type gallium nitride (GaN) layer 7 is made shorter than the length of the p-type gallium nitride (GaN) layer 7, i.e., the channel length L, in other words, the interval d and the channel length L are set to satisfy an inequality: L>d, to reliably deplete the channel formed immediately under the gate electrode 6 and realize a normally-off state. Therefore, a variation in gate threshold voltage with respect to a drain voltage can be decreased.

FIG. 4A is a plan view typically showing the configuration of a nitride power semiconductor device according to the third embodiment of the present invention. FIGS. 4B and 4C are sectional views typically showing the configuration of the same. FIGS. 4B and 4C show sectional structures along lines A-A' and B-B' shown in FIG. 4A, respectively.

The nitride power semiconductor device according to the third embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, stripe-shaped p-type gallium nitride (GaN) layers 3 formed in substantially parallel to each other at predetermined intervals in a predetermined region on the n-type aluminum gallium nitride (AlGaN) layer 2, a source electrode 4 formed on the n-type aluminum gallium nitride (AlGaN) layer 2 to be electrically connected to one ends of the p-type gallium nitride (GaN) layers 3, a drain electrode 5 formed on the n-type aluminum gallium nitride (AlGaN) layer 2 and spaced apart from the other ends of the p-type gallium nitride (GaN) layers 3, a p-type gallium nitride (GaN) layer 7 formed on the n-type aluminum gallium nitride (AlGaN) layer 2 between the source electrode 4 and the drain electrode 5 in the side of the source electrode 4 with respect to the other ends of the p-type gallium nitride (GaN) layers 3, a gate electrode 6 formed on the p-type gallium nitride (GaN) layer 7, an insulating film 8 formed to cover the gate electrode 6, the p-type gallium nitride (GaN) layer 7 and the p-type gallium nitride (GaN) layers 3, and a field plate electrode 9 formed on the insulating film 8 to cover the gate electrode 6, the p-type gallium nitride (GaN) layer 7 and the p-type gallium nitride (GaN) layers 3 and electrically connected to the source electrode 4.

More specifically, the nitride power semiconductor device according to the third embodiment of the present invention is obtained by additionally forming a field plate electrode 9 which is formed to cover the gate electrode 6, the p-type gallium nitride (GaN) layer 7 and the p-type gallium nitride (GaN) layers 3 via the insulating film 8 and which is electrically connected to the source electrode 4 in the nitride power semiconductor device according to the second embodiment of the present invention.

The field plate electrode 9 is formed to moderate the electric fields at the ends of the p-type gallium nitride (GaN) layers 3, thereby making it possible to realize a high breakdown voltage.

The field plate electrode 9 may be formed in not only the third embodiment but also the other embodiments.

FIG. 5A is a plan view typically showing the configuration of a nitride power semiconductor device according to the fourth embodiment of the present invention. FIGS. 5B and 5C are sectional views typically showing the configuration of the same. FIGS. 5B and 5C show sectional structures along lines A-A' and B-B' shown in FIG. 5A, respectively.

The nitride power semiconductor device according to the third embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, stripe-shaped p-type gallium nitride (GaN) layers 3 formed in substantially parallel to each other at predetermined intervals in a predetermined region on the n-type aluminum gallium nitride (AlGaN) layer 2, a source electrode 4 formed on the n-type aluminum gallium nitride (AlGaN) layer 2 to be electrically connected to one ends of the p-type gallium nitride (GaN) layers 3, a drain electrode 5 formed on the n-type aluminum gallium nitride (AlGaN) layer 2 and spaced apart from the other ends of the p-type gallium nitride (GaN) layers 3, a p-type gallium nitride (GaN) layer 7 formed on the n-type aluminum gallium nitride (AlGaN) layer 2 between the source electrode 4 and the drain electrode 5 in the side of the source electrode 4 with respect to the other ends of the p-type gallium nitride (GaN) layers 3, a gate electrode 6 formed on the p-type gallium nitride (GaN) layer 7, an insulating film 8 formed to cover the gate electrode 6, the p-type gallium nitride (GaN) layer 7 and the p-type gallium nitride (GaN) layers 3, a field plate electrode 9 formed on the insulating film 8 to cover the gate electrode 6, the p-type gallium nitride (GaN) layer 7 and the p-type gallium nitride (GaN) layers 3 and electrically connected to the source electrode 4, and a second field plate electrode 10 formed on the insulating film 8 to cover a region near the drain electrode 5 and electrically connected to the drain electrode 5.

More specifically, the nitride power semiconductor device according to the fourth embodiment of the present invention is obtained by additionally forming the second field plate electrode 10 formed to cover the region near the drain electrode 5 via the insulating film 8 and electrically connected to the drain electrode 5 in the nitride power semiconductor device according to the third embodiment of the present invention.

The second field plate electrode 10 is formed to moderate an electric field at the ends of the drain electrode 5, thereby making it possible to realize a higher breakdown voltage.

In the structure of the nitride power semiconductor device according to the fourth embodiment of the present invention, when a high voltage is applied to the drain electrode 5, if avalanche breakdown occurs, the avalanche breakdown may be reliably controlled to occur at the ends of the p-type gallium nitride (GaN) layers 3 but the ends of the drain electrode 5. In this case, holes are reliably discharged to make it possible to secure a high avalanche withstanding capability.

For this purpose, a distance from an end of the gate electrode 6 to an end of the field plate electrode 9 may be made shorter than a distance from an end of the drain electrode 5 to an end of the second field plate electrode 10.

The field plate electrode 9 and the second field plate electrode 10 may be formed in not only the fourth embodiment but also the other embodiments.

FIG. 6A is a plan view typically showing the configuration of a nitride power semiconductor device according to the fifth embodiment of the present invention. FIGS. 6B and 6C are sectional views typically showing the configuration of the same. FIGS. 6B and 6C show sectional structures along lines A-A' and B-B' shown in FIG. 6A, respectively.

The nitride power semiconductor device according to the fifth embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, stripe-shaped p-type gallium nitride (GaN) layers 3 formed in substantially parallel to each other at predetermined intervals in a predetermined region on the n-type aluminum gallium nitride (AlGaN) layer 2, a source electrode 4 formed on the n-type aluminum gallium nitride (AlGaN) layer 2 to be electrically connected to one ends of the p-type gallium nitride (GaN) layers 3, a drain electrode 5 formed on the n-type aluminum gallium nitride (AlGaN) layer 2 and spaced apart from the other ends of the p-type gallium nitride (GaN) layers 3, a gate insulating film 11 formed to cover the n-type aluminum gallium nitride (AlGaN) layer 2 and the p-type gallium nitride (GaN) layers 3 between the source electrode 4 and the drain electrode 5, and a gate electrode 6 formed on the gate insulating film 11 between the source electrode 4 and the drain electrode 5 in the side of the source electrode 4 with respect to the other ends of the p-type gallium nitride (GaN) layers 3.

In the nitride power semiconductor device according to the fifth embodiment of the present invention, unlike in the nitride power semiconductor device according to the first embodiment of the present invention, the gate insulating film 11 is formed between the gate electrode 6 and the n-type aluminum gallium nitride (AlGaN) layer 2.

Therefore, the gate electrode 6 does not form a Schottky junction with the n-type aluminum gallium nitride (AlGaN) layer 2, and the nitride power semiconductor device according to the fifth embodiment of the present invention has a MIS gate structure.

As is apparent from this structure, the nitride power semiconductor device according to the fifth embodiment of the present invention is a horizontal gallium-nitride based field effect transistor having a MIS gate structure (MIS-HFET) including an aluminum gallium nitride/gallium nitride (AlGaN/GaN) heterostructure.

The nitride power semiconductor device according to the fifth embodiment of the present invention can achieve the same effect as that of the nitride power semiconductor device according to the first embodiment of the present invention. Furthermore, the gate insulating film 11 is formed to make it possible to dramatically decrease a gate leakage current and to reduce a load on the gate driver circuit.

Figure 7A:
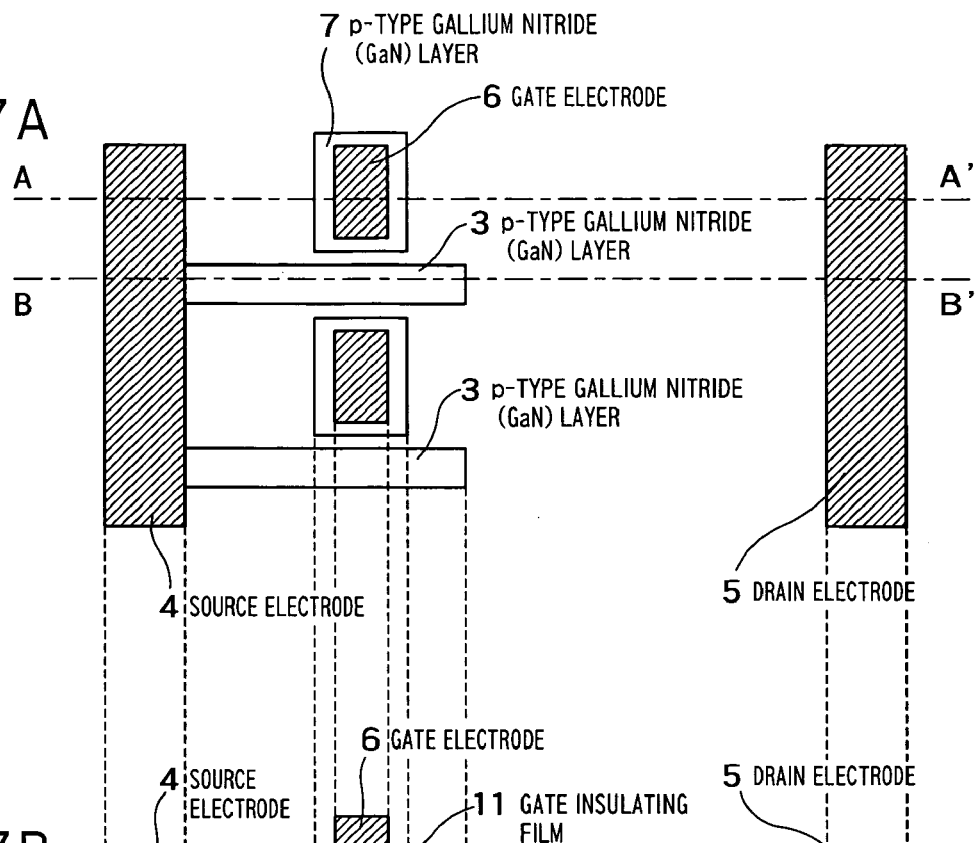
FIG. 7A is a plan view typically showing the configuration of a nitride power semiconductor device according to a sixth embodiment of the present invention.
Figure 7B:
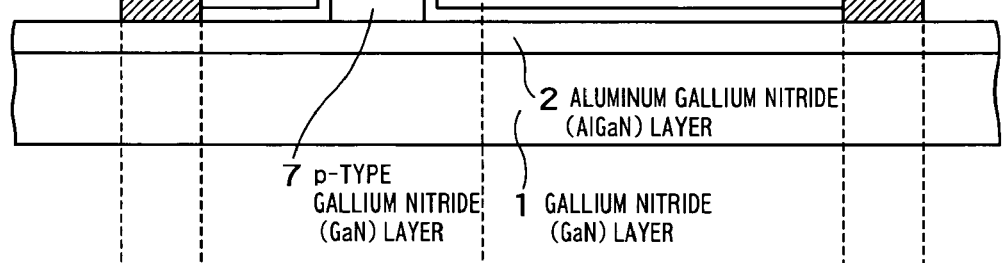
FIGS. 7B and 7C are sectional views typically showing the configuration of the same.
Figure 7C:
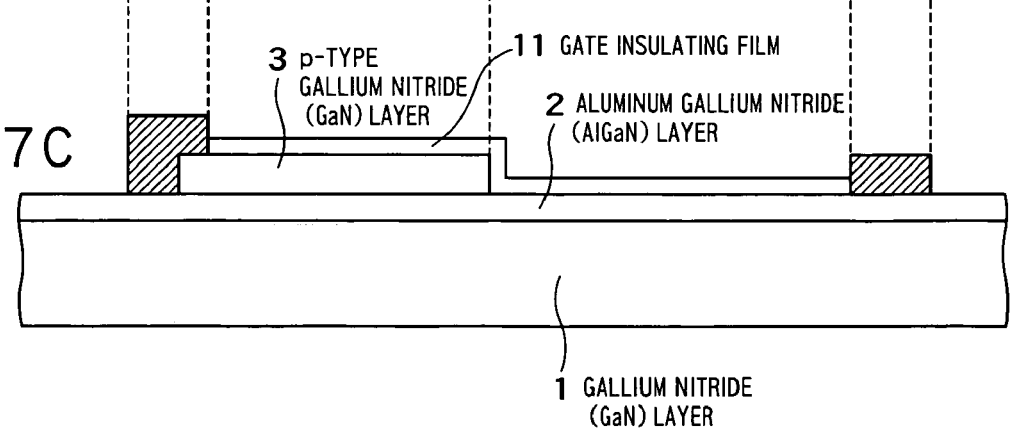

FIG. 7A is a plan view typically showing the configuration of a nitride power semiconductor device according to the sixth embodiment of the present invention. FIGS. 7B and 7C are sectional views typically showing the configuration of the same. FIGS. 7B and 7C show sectional structures along lines A-A' and B-B' shown in FIG. 7A, respectively.

The nitride power semiconductor device according to the sixth embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, stripe-shaped p-type gallium nitride (GaN) layers 3 formed in substantially parallel to each other at predetermined intervals in a predetermined region on the n-type aluminum gallium nitride (AlGaN) layer 2, a source electrode 4 formed on the n-type aluminum gallium nitride (AlGaN) layer 2 to be electrically connected to one ends of the p-type gallium nitride (GaN) layers 3, a drain electrode 5 formed on the n-type aluminum gallium nitride (AlGaN) layer 2 and spaced apart from the other ends of the p-type gallium nitride (GaN) layers 3, a p-type gallium nitride (GaN) layer 7 formed on the n-type aluminum gallium nitride (AlGaN) layer 2 between the source electrode 4 and the drain electrode 5 in the side of the source electrode 4 with respect to the other ends of the p-type gallium nitride (GaN) layers 3, a gate insulating film 11 formed to cover the n-type aluminum gallium nitride (AlGaN) layer 2, the p-type gallium nitride (GaN) layers 3 and the p-type gallium nitride (GaN) layer 7 between the source electrode 4 and the drain electrode 5, and a gate electrode 6 formed on the gate insulating film 11 in a region above the p-type gallium nitride (GaN) layer 7.

More specifically, the nitride power semiconductor device according to the sixth embodiment of the present invention is obtained by additionally forming the p-type gallium nitride (GaN) layer 7 between the n-type aluminum gallium nitride (AlGaN) layer 2 immediately under the gate electrode 6 and the gate insulating film 11 in the nitride power semiconductor device according to the fifth embodiment of the present invention. In other words, the p-type gallium nitride (GaN) layer 7 is formed to be sandwiched between the n-type aluminum gallium nitride (AlGaN) layer 2 and the gate electrode 6 via the gate insulating film 11.

The p-type gallium nitride (GaN) layer 7 is formed to deplete a channel immediately under the p-type gallium nitride (GaN) layer 7 when no voltage is applied to the gate electrode 6 in the horizontal gallium-nitride based field effect transistor having a MIS gate structure (MIS-HFET), thereby making it possible to realize a normally-off state.

In a conventional normally-off type field effect transistor, when a MIS gate structure is employed, the p-type gallium nitride (GaN) layer 7 is not connected to any electrode. Therefore, holes generated in avalanche breakdown cannot be discharged, and an avalanche withstanding capability is very low.

On the other hand, in the nitride power semiconductor device according to the sixth embodiment of the present invention, since the p-type gallium nitride (GaN) layers 3 electrically connected to the source electrode 4 and extending and projecting to the side of the drain electrode 5 with respect to the gate electrode 6 are formed on the n-type aluminum gallium nitride (AlGaN) layer 2, a MIS gate structure can be employed as a gate structure while keeping an avalanche withstanding capability.

Incidentally, interface states exist on the interface between a gate insulating film and a semiconductor layer. When a voltage is applied across the gate and the drain at a high temperature, carriers are trapped by the interface states to make a state as if fixed charges are generated.

In a conventional MIS gate structure field effect transistor, a current cannot flow because the current is blocked by a gate insulating film. Accordingly, the fixed charges cannot be removed. As a result, an electric field distribution in the device changes. In addition, an amount of fixed charge is excessively large to decrease the breakdown voltage of the device.

On the other hand, in the nitride power semiconductor device according to the sixth embodiment of the present invention, even though carriers are trapped by the interface states, a current can flow between the p-type gallium nitride (GaN) layers 3 and the drain electrode 5. Therefore, fixed charges are not generated.

In this manner, the structure of the nitride power semiconductor device according to the sixth embodiment of the present invention is also effective to improve reliability at a high temperature.

Figure 8:
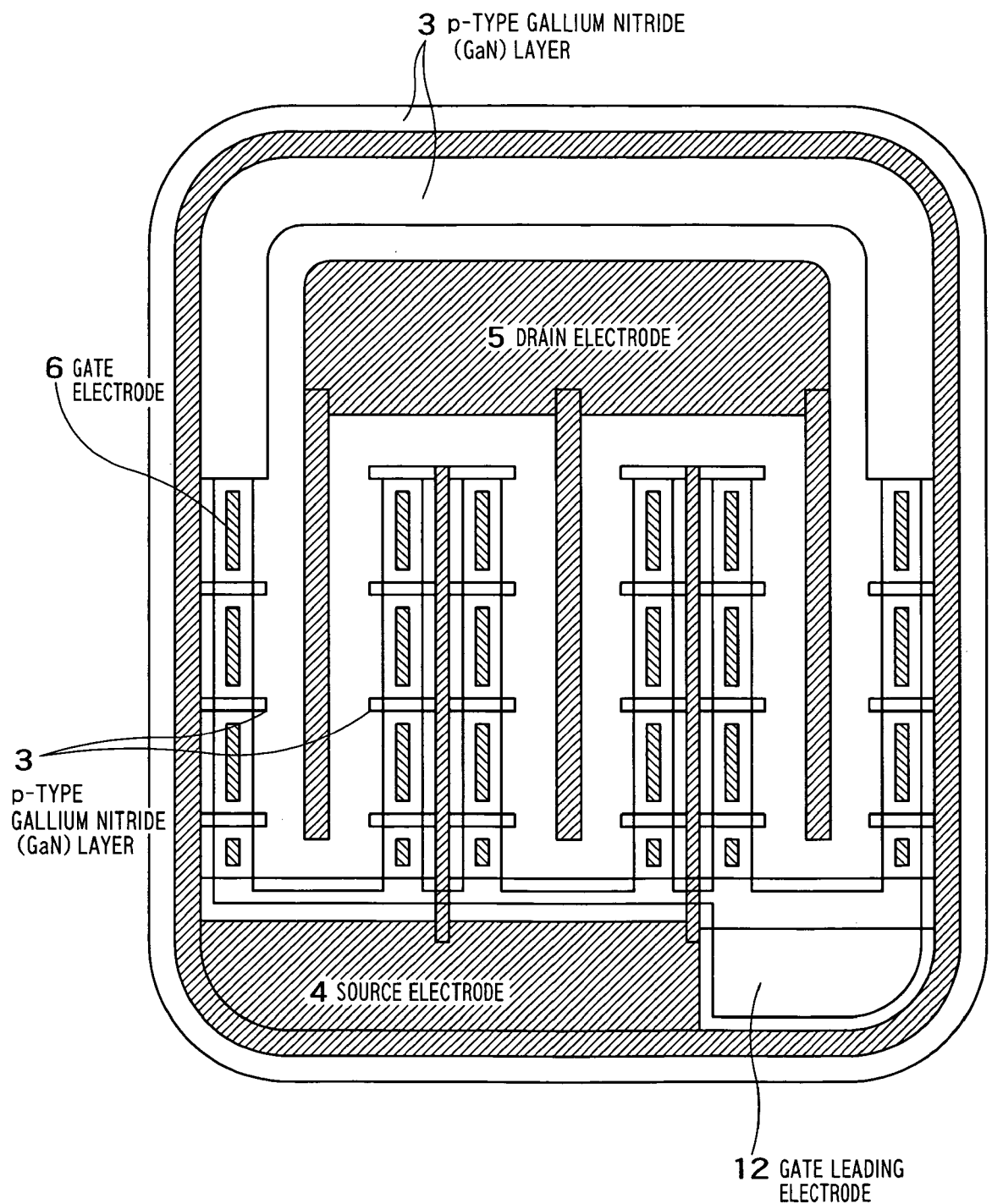
FIG. 8 is a plan view typically showing the configuration of a nitride power semiconductor device according to a seventh embodiment of the present invention.

FIG. 8 is a plan view typically showing the configuration of a nitride power semiconductor device according to a seventh embodiment of the present invention.

The nitride power semiconductor device according to the seventh embodiment of the present invention relates to a planar configuration of an entire device block which can be applied to the nitride power semiconductor device according to each of the embodiments of the present invention.

As shown in FIG. 8, the device block of the nitride power semiconductor device according to the seventh embodiment of the present invention includes: a source electrode 4 having a device region source electrode wiring extending in a device region of a device block including a plurality of devices, a peripheral source electrode wiring formed around a peripheral portion of the device block, and a leading source electrode wiring used to connect the device region source electrode wiring and the peripheral source electrode wiring to an external circuit; a drain electrode 5 having a device region drain electrode wiring extending in the device region of the device block and a leading drain electrode wiring used to connect the device region drain electrode wiring to an external circuit; p-type gallium nitride (GaN) layers 3 having device region p-type gallium nitride (GaN) layers formed in stripe-shape and in substantially parallel to each other at predetermined intervals to extend from the device region source electrode wiring to the device region drain electrode wiring such that one ends of the device region p-type gallium nitride (GaN) layers are electrically connected to the device region source electrode wiring and the other ends are spaced apart from the device region drain electrode wiring, an outer device region p-type gallium nitride (GaN) layer formed between the peripheral source electrode wiring and the leading drain electrode wiring such that the outer device region p-type gallium nitride (GaN) layer is electrically connected to the peripheral source electrode wiring and spaced apart from the leading drain electrode wiring, and a device isolation region p-type gallium nitride (GaN) layer formed around the peripheral source electrode wing in a device isolation region to insulatively isolate the device block from the outside of the device block; a gate electrode 6 formed between the device region source electrode wiring and the device region drain electrode wiring in the side of the device region source electrode wiring with respect to the ends of the device region p-type gallium nitride (GaN) layer of the device region drain electrode wiring side; and a gate leading electrode 12 used to connect the gate electrode 6 to an external circuit.

More specifically, the nitride power semiconductor device according to the seventh embodiment of the present invention is different from a conventional device structure in that the device isolation region which surrounds the peripheral portion of the device block including the plurality of devices and insulatively isolates the device block from the outside of the device block are formed by the p-type gallium nitride (GaN) layers 3.

In the conventional device structure, a device isolation region is formed by etching or ion implantation.

In contrast to this, in the nitride power semiconductor device according to the seventh embodiment of the present invention, the same effect as that obtained when pn isolation is performed such that a device block peripheral portion is surrounded by the p-type gallium nitride (GaN) layers 3 can be obtained. Accordingly, pattern formation for the p-type gallium nitride (GaN) layers 3 and a device isolation process can be simultaneously performed.

In the device region of the device block, viewing along a direction parallel to the source electrode 4 and the drain electrode 5, the stripe-shaped device region p-type gallium nitride (GaN) layers 3 formed at predetermined intervals and the gate electrodes 6 formed at predetermined intervals are alternately arranged. Therefore, the gate leading electrodes 12 for leading the gate electrodes 6 are formed by a multilevel interconnection technology.

The stripe-shaped p-type gallium nitride (GaN) layers 3 do not have to be always uniformly formed in the device region, and may be formed in only a part of the device region. In this case, the same effect as described above can be obtained in the corresponding region.

Figure 9:
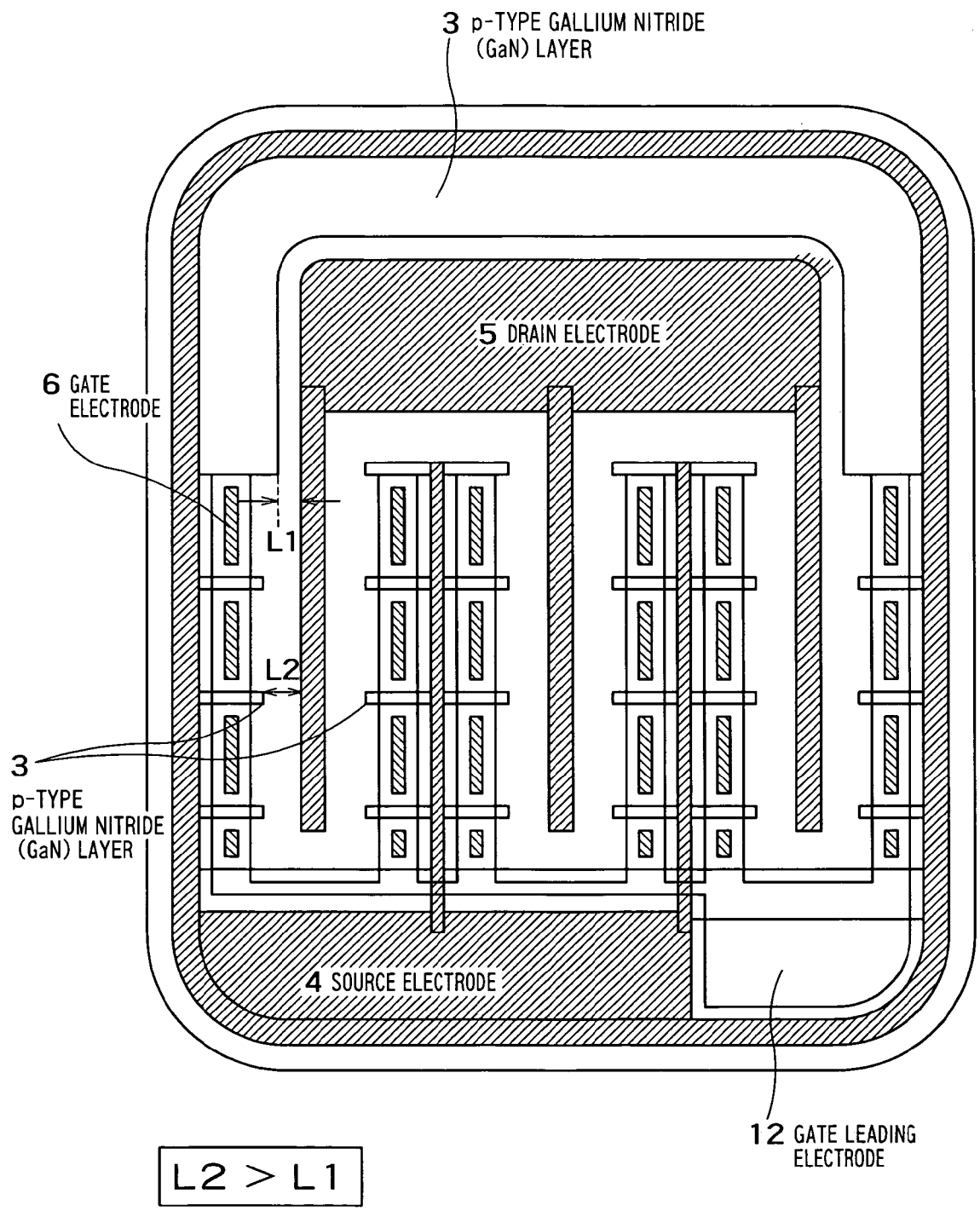
FIG. 9 is a plan view typically showing the configuration of a nitride power semiconductor device according to an eighth embodiment of the present invention.

FIG. 9 is a plan view typically showing the configuration of a nitride power semiconductor device according to an eighth embodiment of the present invention.

The nitride power semiconductor device according to the eighth embodiment of the present invention, like the nitride power semiconductor device according to the seventh embodiment of the present invention, relates to a planar configuration of an entire device block which can be applied to the nitride power semiconductor device according to each of the embodiments of the present invention. The nitride power semiconductor device according to the eighth embodiment of the present invention is a modification obtained by partially changing the configuration of the nitride power semiconductor device according to the seventh embodiment of the present invention.

In the nitride power semiconductor device according to the eighth embodiment of the present invention, as shown in FIG. 9, a distance L1 between the leading drain electrode wiring of the drain electrode 5 out of the device region and the outer device region p-type gallium nitride (GaN) layer of the p-type gallium nitride (GaN) layer 3 is set to be shorter than a distance L2 between the device region drain electrode wiring of the drain electrode 5 in the device region and the outer device region p-type gallium nitride (GaN) layer of the p-type gallium nitride (GaN) layer 3.

In this manner, the distance between the p-type gallium nitride (GaN) layers 3 and the drain electrode 5 is changed depending on regions in the device block to make it possible to lead a portion where avalanche breakdown occurs to a predetermined region.

For example, as in the example in FIG. 9, when the distance L1 and L2 are set to satisfy an inequality: L1<L2, if avalanche breakdown occurs, the avalanche breakdown occurs out of the device region (in the outer device region) but in the device region.

Therefore, breakdown of the device region caused by avalanche breakdown can be reliably prevented. If the avalanche breakdown occurs, an avalanche current can be avoided from flowing into the gate driver circuit.

The planar configurations of the nitride power semiconductor devices according to the seventh and eighth embodiments shown in FIGS. 8 and 9 completely correspond to the planar configuration of the nitride power semiconductor device according to the first embodiment of the present invention shown in FIGS. 1A to 1C. However, as described above, the planar configurations of the nitride power semiconductor devices according to the seventh and eighth embodiments of the present invention can also be applied to the nitride power semiconductor devices according to the second to sixth embodiments of the present invention shown in FIGS. 2 to 7, i.e., a normally-off type structure device and a MIS gate structure device.

Figure 10A:
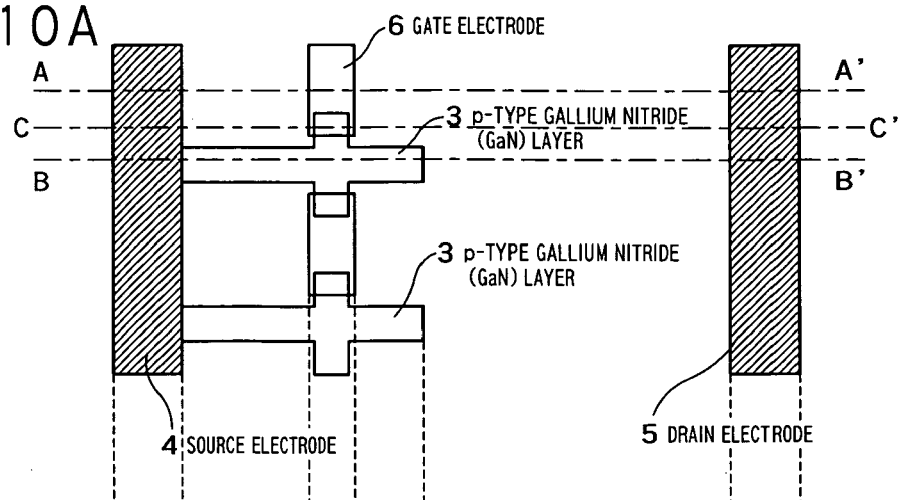
FIG. 10A is a plan view typically showing the configuration of a nitride power semiconductor device according to a ninth embodiment of the present invention.
Figure 10B:
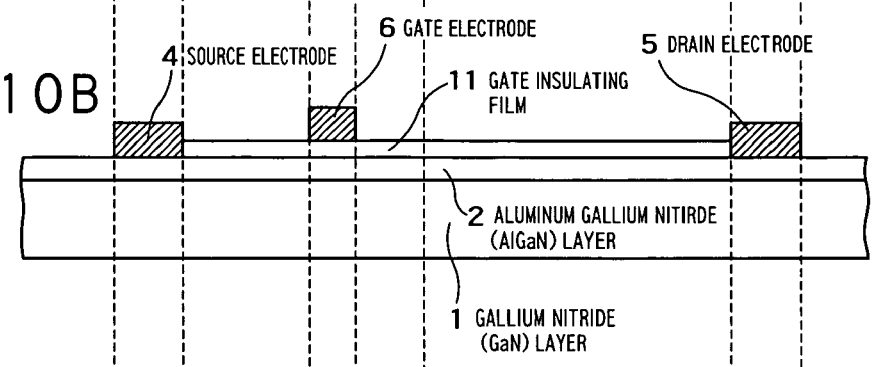
FIGS. 10B, 10C and 10D are sectional views typically showing the configuration of the same.
Figure 10C:
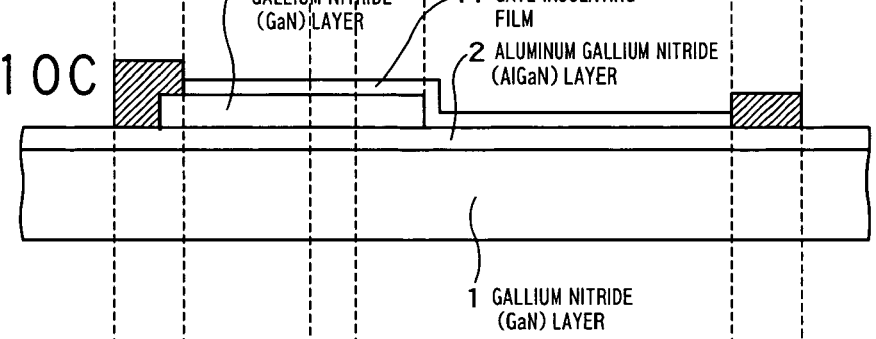
Figure 10D:
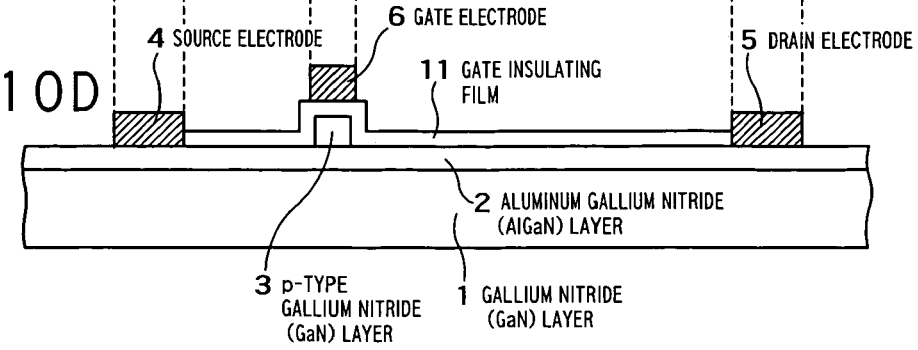

FIG. 10A is a plan view typically showing the configuration of a nitride power semiconductor device according to the ninth embodiment of the present invention. FIGS. 10B, 10C and 10D are sectional views typically showing the configuration of the same. FIGS. 10B, 10C and 10D show sectional structures along lines A-A', B-B' and C-C' shown in FIG. 10A, respectively.

The nitride power semiconductor device according to the ninth embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, stripe-shaped p-type gallium nitride (GaN) layers 3 formed in substantially parallel to each other at predetermined intervals in a predetermined region on the n-type aluminum gallium nitride (AlGaN) layer 2 and having projecting portions projecting in a direction crossing a longitudinal direction at a predetermined position, a source electrode 4 formed on the n-type aluminum gallium nitride (AlGaN) layer 2 to be electrically connected to one ends of the p-type gallium nitride (GaN) layers 3 in the longitudinal direction, a drain electrode 5 formed on the n-type aluminum gallium nitride (AlGaN) layer 2 and spaced apart from the other ends of the p-type gallium nitride (GaN) layers 3 in the longitudinal direction, a gate insulating film 11 formed to cover the n-type aluminum gallium nitride (AlGaN) layer 2 and the p-type gallium nitride (GaN) layers 3 between the source electrode 4 and the drain electrode 5, and a gate electrode 6 formed on the gate insulating film 11 between the source electrode 4 and the drain electrode 5 in the side of the source electrode 4 with respect to the other ends of the p-type gallium nitride (GaN) layers 3 in the longitudinal direction and to partially overlap the projecting portions of the p-type gallium nitride (GaN) layers 3 via the gate insulating film 11.

The nitride power semiconductor device according to the ninth embodiment of the present invention, like the nitride power semiconductor device according to the fifth embodiment of the present invention shown in FIGS. 6a to 6C, is a horizontal gallium-nitride based field effect transistor having a MIS gate structure (MIS-HFET) including an aluminum gallium nitride/gallium nitride (AlGaN/GaN) heterostructure, and in which the gate insulating film 11 is formed between the gate electrode 6 and the n-type aluminum gallium nitride (AlGaN) layer 2.

In the nitride power semiconductor device according to the ninth embodiment of the present invention, the p-type gallium nitride (GaN) layers 3 do not have simple striped shapes. The p-type gallium nitride (GaN) layers 3 have the projecting portions projecting in the direction crossing the longitudinal direction at the predetermined position. Moreover, the gate electrode 6 is formed to partially overlap the projecting portions of the p-type gallium nitride (GaN) layers 3 via the gate insulating film 11.

In other words, the p-type gallium nitride (GaN) layers 3 having projecting portions designed in advance are formed such that a part of the gate electrode 6 overlaps the projecting portions of the p-type gallium nitride (GaN) layers 3 via the gate insulating film 11 when the gate electrode 6 is formed on the gate insulating film 11.

When the structure is adapted, a potential distribution of a channel portion immediately under the gate electrode 6 depends on the p-type gallium nitride (GaN) layers 3.

An interval between one of the p-type gallium nitride (GaN) layers 3 which overlaps one end of the gate electrode 6 via the gate insulating film 11 and the other p-type gallium nitride (GaN) layers 3 which overlap the other end of the gate electrode 6 is changed to make it possible to control a gate threshold voltage of the device. For example, when the interval between the two p-type gallium nitride (GaN) layers 3 is made narrowly, the gate threshold voltage of the device can be shifted to the positive direction.

In the structure of the nitride power semiconductor device according to the sixth embodiment of the present invention shown in FIGS. 7A to 7C and serving as a modification of the nitride power semiconductor device according to the fifth embodiment of the present invention, the gate threshold voltage of the device varies depending on an impurity concentration of the p-type gallium nitride (GaN) layer 7 immediately under the gate electrode 6. On the other hand, in the nitride power semiconductor device according to the ninth embodiment of the present invention shown in FIGS. 10A to 10D, the gate threshold voltage of the device varies depending on the interval between the two p-type gallium nitride (GaN) layers 3 which overlap both the ends of the gate electrode 6 via the gate insulating film 11.

An impurity activation rate of a p-type gallium nitride (GaN) layer is generally low, and the concentration of the activated impurity easily fluctuates. For this reason, when the gate threshold voltage of the device is controlled by the impurity concentration of the p-type gallium nitride (GaN) layer 7 immediately under the gate electrode 6, the gate threshold voltage of the device also easily fluctuates.

However, in the structure of the nitride power semiconductor device according to the ninth embodiment of the present invention, the gate threshold voltage of the device is determined by the sizes of the p-type gallium nitride (GaN) layers 3. For this reason, the fluctuation of the impurity concentration of the p-type gallium nitride (GaN) layers 3 does not influence the gate threshold voltage of the device, and the fluctuation of the gate threshold voltage of the device is determined by a fluctuation of the processing size depending on the processing accuracy of etching or the like.

The fluctuation of the processing size depending on the processing accuracy of etching or the like is smaller than a fluctuation of an impurity concentration in crystal growth.

Therefore, the nitride power semiconductor device according to the ninth embodiment of the present invention can achieve the same effect as that of the nitride power semiconductor device according to the fifth embodiment of the present invention, and the fluctuation of the gate threshold voltage of the device can be suppressed to a low level.

Incidentally, in the nitride power semiconductor device according to the ninth embodiment of the present invention shown in FIGS. 10A to 10D, although the gate electrodes 6 are formed in the island shape, the gate electrode 6 may be formed in the continuous stripe-shape, because the gate insulating film 11 is formed between the p-type gallium nitride (GaN) layers 3 and the gate electrode 6 and covers the p-type gallium nitride (GaN) layers 3.

Figure 11:
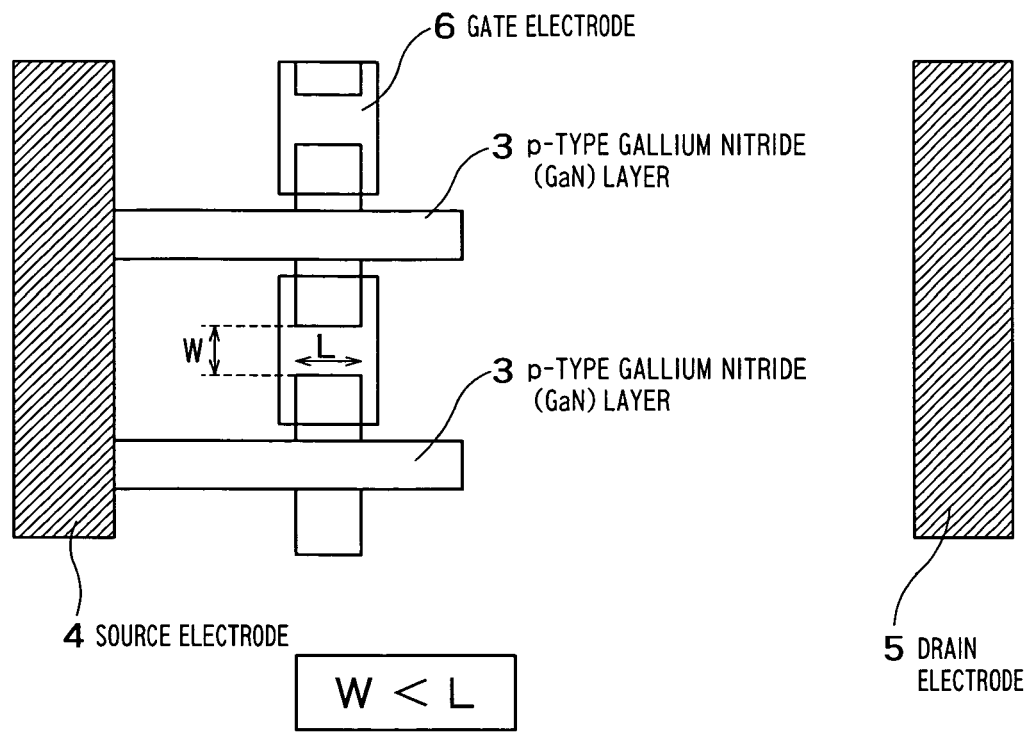
FIG. 11 is a plan view showing a length L of the projecting portions of the p-type gallium nitride (GaN) layers 3 and an interval W between the projecting portions in the nitride power semiconductor device according to the ninth embodiment of the present invention.

FIG. 11 is a plan view showing a length L of the projecting portions of the p-type gallium nitride (GaN) layers 3 and an interval W between the projecting portions in the nitride power semiconductor device according to the ninth embodiment of the present invention.

The length L of the projecting portion of the p-type gallium nitride (GaN) layer 3 is a size of the projecting portions of the p-type gallium nitride (GaN) layers 3 in the direction extending from the source electrode 4 to the drain electrode 5, i.e., in the longitudinal direction of the stripe-shaped p-type gallium nitride layers 3.

The interval W of the two projecting portions of the p-type gallium nitride (GaN) layers 3 is an interval between one of the p-type gallium nitride (GaN) layers 3 which overlaps one end of the gate electrode 6 via the gate insulating film 11 and the other p-type gallium nitride (GaN) layers 3 which overlaps the other end of the gate electrode 6 via the gate insulating film 11.

In this case, the interval W between the projecting portions of the p-type gallium nitride layers 3 in the nitride power semiconductor device according to the ninth embodiment of the present invention is set to be smaller than the length L of the projecting portions, i.e., the interval W and the length L are set to satisfy an inequality: W<L.

When a high voltage is applied to the drain electrode 5, the high voltage affects to not only a potential distribution between the gate electrode and the drain electrode but also a potential distribution of the channel portion immediately under the gate electrode 6.

At this time, even though the gate voltage is smaller than the threshold voltage, when a potential barrier of the channel portion is pushed down by the drain voltage, a current flows between the source and the drain to increase an off-leak current. As a result, soft breakdown may occur.

However, when the dimensions as shown in FIG. 11 are set, an electric field from the drain is shielded by the p-type gallium nitride (GaN) layers 3 to make it possible to prevent the potential distribution of the channel portion from varying. As a result, the occurrence of the soft breakdown can be suppressed.

Figure 12:
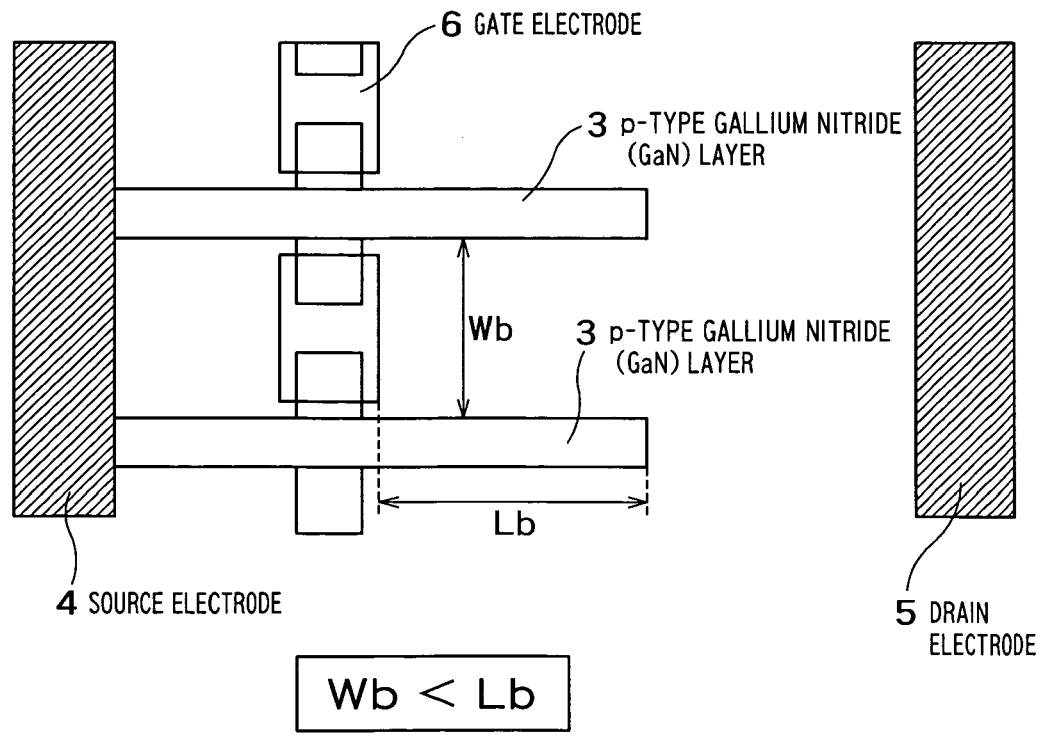
FIG. 12 is a plan view showing an interval Wb between the p-type gallium nitride layers 3 and a length Lb between an end of the gate electrode 6 on the drain electrode 5 side and ends of the p-type gallium nitride layers 3 on the drain electrode 5 side in the nitride power semiconductor device according to the ninth embodiment of the present invention.

FIG. 12 is a plan view showing an interval Wb between the p-type gallium nitride layers 3 and a length Lb between an end of the gate electrode 6 on the drain electrode 5 side and ends of the p-type gallium nitride layers 3 on the drain electrode 5 side in the nitride power semiconductor device according to the ninth embodiment of the present invention.

In this case, the interval Wb between the p-type gallium nitride layers 3 in the nitride power semiconductor device according to the ninth embodiment of the present invention is set to be smaller than the length Lb between the end of the gate electrode 6 on the drain electrode 5 side and the ends of the p-type gallium nitride layers 3 on the drain electrode 5 side, i.e., the interval Wb and the length Lb are set to satisfy an inequality: Wb<Lb.

When the dimensions are set, even in the case that a higher voltage is applied to the drain electrode 5, the potential distribution of the channel portion is not easily affected, and an off-leak current generated by an increase in drain voltage can be suppressed from increasing.

FIG. 13A is a plan view typically showing the configuration of a nitride power semiconductor device according to the tenth embodiment of the present invention. FIGS. 13B and 13C are sectional views typically showing the configuration of the same. FIGS. 13B and 13C show sectional structures along lines A-A' and B-B' shown in FIG. 13A, respectively.

The nitride power semiconductor device according to the tenth embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, p-type gallium nitride (GaN) layers 3 formed in stripe-shaped recess portions formed in substantially parallel to each other at predetermined intervals in a depth corresponding to a level difference between the surface of the n-type aluminum gallium nitride (AlGaN) layer 2 and the surface portion of the gallium nitride (GaN) layer 1 in a predetermined region of the n-type aluminum gallium nitride (AlGaN) layer 2 to project over the n-type aluminum gallium nitride (AlGaN) layer 2, a source electrode 4 formed on the n-type aluminum gallium nitride (AlGaN) layer 2 to be electrically connected to one ends of the p-type gallium nitride (GaN) layers 3, a drain electrode 5 formed on the n-type aluminum gallium nitride (AlGaN) layer 2 and spaced apart from the other ends of the p-type gallium nitride (GaN) layers 3, and a gate electrode 6 formed on the n-type aluminum gallium nitride (AlGaN) layer 2 between the source electrode 4 and the drain electrode 5 in the side of the source electrode 4 with respect to the other ends of the p-type gallium nitride (GaN) layers 3.

In the nitride power semiconductor device according to the first embodiment of the present invention shown in FIGS. 1A to 1C, the p-type gallium nitride (GaN) layers 3 are formed on the n-type aluminum gallium nitride (AlGaN) layer 2. On the other hand, in the nitride power semiconductor device according to the tenth embodiment of the present invention shown in FIGS. 13A to 13C, the p-type gallium nitride (GaN) layers 3 are formed in the recess portions in the depth corresponding to the level difference between the surface of the n-type aluminum gallium nitride (AlGaN) layer 2 and the surface portion of the gallium nitride (GaN) layer 1 to project over the n-type aluminum gallium nitride (AlGaN) layer 2. More specifically, the nitride power semiconductor device according to the tenth embodiment of the present invention is different from the nitride power semiconductor device according to the first embodiment of the present invention in that the p-type gallium nitride (GaN) layers 3 are formed to be buried in the gallium nitride (GaN) layer 1.

In the nitride power semiconductor device according to the first embodiment of the present invention in which the p-type gallium nitride (GaN) layers 3 are formed on the n-type aluminum gallium nitride (AlGaN) layer 2, holes generated in the gallium nitride (GaN) layer 1 when avalanche breakdown occurs due to an application of a high voltage to the drain electrode 5 do not easily flow into the p-type gallium nitride (GaN) layers 3 such that discontinuous bands in a hetero interface between the n-type aluminum gallium nitride (AlGaN) layer 2 and the gallium nitride (GaN) layer 1 serve as barriers.

On the contrary, in the nitride power semiconductor device according to the tenth embodiment of the present invention, since the discontinuous bands are not present between the gallium nitride (GaN) layer 1 and the p-type gallium nitride (GaN) layers 3, holes generated in the gallium nitride (GaN) layer 1 are rapidly discharged through the p-type gallium nitride (GaN) layers 3.

Even though avalanche breakdown occurs in a junction between the n-type aluminum gallium nitride (AlGaN) layer 2 and the p-type gallium nitride (GaN) layers 3, the holes are rapidly discharged through the p-type gallium nitride (GaN) layers 3, because the p-type gallium nitride (GaN) layers 3 are in contact with the n-type aluminum gallium nitride (AlGaN) layer 2.

With the above structure, the nitride power semiconductor device according to the tenth embodiment of the present invention can secure a high avalanche withstanding capability.

FIG. 14A is a plan view typically showing the configuration of a nitride power semiconductor device according to the eleventh embodiment of the present invention. FIGS. 14B and 14C are sectional views typically showing the configuration of the same. FIGS. 14B and 14C show sectional structures along lines A-A' and B-B' shown in FIG. 14A, respectively.

The nitride power semiconductor device according to the eleventh embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, p-type gallium nitride (GaN) layers 3 formed in stripe-shaped recess portions formed in substantially parallel to each other at predetermined intervals in a depth corresponding to a level difference between the surface of the n-type aluminum gallium nitride (AlGaN) layer 2 and the surface portion of the gallium nitride (GaN) layer 1 in a predetermined region of the n-type aluminum gallium nitride (AlGaN) layer 2 to project over the n-type aluminum gallium nitride (AlGaN) layer 2, a source electrode 4 formed on the n-type aluminum gallium nitride (AlGaN) layer 2 to be electrically connected to one ends of the p-type gallium nitride (GaN) layers 3, a drain electrode 5 formed on the n-type aluminum gallium nitride (AlGaN) layer 2 and spaced apart from the other ends of the p-type gallium nitride (GaN) layers 3, a gate insulating film 11 formed to cover the n-type aluminum gallium nitride (AlGaN) layer 2 and the p-type gallium nitride (GaN) layers 3 between the source electrode 4 and the drain electrode 5, and a gate electrode 6 formed on the gate insulating film 11 between the source electrode 4 and the drain electrode 5 in the side of the source electrode 4 with respect to the other ends of the p-type gallium nitride (GaN) layers 3.

The nitride power semiconductor device according to the eleventh embodiment of the present invention, like the nitride power semiconductor device according to the fifth embodiment of the present invention shown in FIGS. 6a to 6C, is a horizontal gallium-nitride based field effect transistor having a MIS gate structure (MIS-HFET) including an aluminum gallium nitride/gallium nitride (AlGaN/GaN) heterostructure, and in which the gate insulating film 11 is formed between the gate electrode 6 and the n-type aluminum gallium nitride (AlGaN) layer 2.

The structure of the p-type gallium nitride (GaN) layers 3 and a periphery thereof is the same structure as that of the nitride power semiconductor device according to the tenth embodiment of the present invention shown in FIGS. 13A to 13C.

In the nitride power semiconductor device having a MIS gate structure according to the eleventh embodiment of the present invention, the same effect as that of the nitride power semiconductor device according to the tenth embodiment of the present invention can be obtained.

FIG. 15A is a plan view typically showing the configuration of a nitride power semiconductor device according to the twelfth embodiment of the present invention. FIGS. 15B and 15C are sectional views typically showing the configuration of the same. FIGS. 15B and 15C show sectional structures along lines A-A' and B-B' shown in FIG. 15A, respectively.

The nitride power semiconductor device according to the eleventh embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, p-type gallium nitride (GaN) layers 3 formed in stripe-shaped recess portions formed in substantially parallel to each other at predetermined intervals and having projecting portions projecting in a direction crossing a longitudinal direction at a predetermined position in a depth corresponding to a level difference between the surface of the n-type aluminum gallium nitride (AlGaN) layer 2 and the surface portion of the gallium nitride (GaN) layer 1 in a predetermined region of the n-type aluminum gallium nitride (AlGaN) layer 2 to project over the n-type aluminum gallium nitride (AlGaN) layer 2, a source electrode 4 formed on the n-type aluminum gallium nitride (AlGaN) layer 2 to be electrically connected to one ends of the p-type gallium nitride (GaN) layers 3 in the longitudinal direction, a drain electrode 5 formed on the n-type aluminum gallium nitride (AlGaN) layer 2 and spaced apart from the other ends of the p-type gallium nitride (GaN) layers 3 in the longitudinal direction, a gate insulating film 11 formed to cover the n-type aluminum gallium nitride (AlGaN) layer 2 and the p-type gallium nitride (GaN) layers 3 between the source electrode 4 and the drain electrode 5, and a gate electrode 6 formed on the gate insulating film 11 between the source electrode 4 and the drain electrode 5 in the side of the source electrode 4 with respect to the other ends of the p-type gallium nitride (GaN) layers 3 in the longitudinal direction and to partially overlap the projecting portions of the p-type gallium nitride (GaN) layers 3 via the gate insulating film 11.

In the nitride power semiconductor device according to the twelfth embodiment of the present invention, like in the nitride power semiconductor device according to the ninth embodiment of the present invention shown in FIGS. 10A to 10C, the p-type gallium nitride (GaN) layers 3 have projecting portions projecting in a direction crossing the longitudinal direction at a predetermined position but simple stripe shapes, and the gate electrode 6 is formed to partially overlap the projecting portions of the p-type gallium nitride (GaN) layers 3 via the gate insulating film 11. Therefore, the recess portions have the projecting portions projecting in a direction crossing the longitudinal direction of the recess portions at the predetermined position, and the projecting portions of the p-type gallium nitride (GaN) layers 3 are formed in the projecting portions of the recess portions.

The horizontal sectional shape of the p-type gallium nitride (GaN) layers 3 is as described above. However, the vertical sectional shape of the p-type gallium nitride (GaN) layers 3 and a periphery thereof is the same as that of the nitride power semiconductor device according to the tenth embodiment of the present invention shown in FIGS. 13A to 13C.

In the nitride power semiconductor device according to the twelfth embodiment of the present invention in which the p-type gallium nitride (GaN) layers 3 are changed in shape, not only the same effect as that of the nitride power semiconductor device according to the ninth embodiment of the present invention, but also the same effect as that of the nitride power semiconductor device according to the tenth embodiment of the present invention can be achieved.

Figures 16A, 16B, 16C:
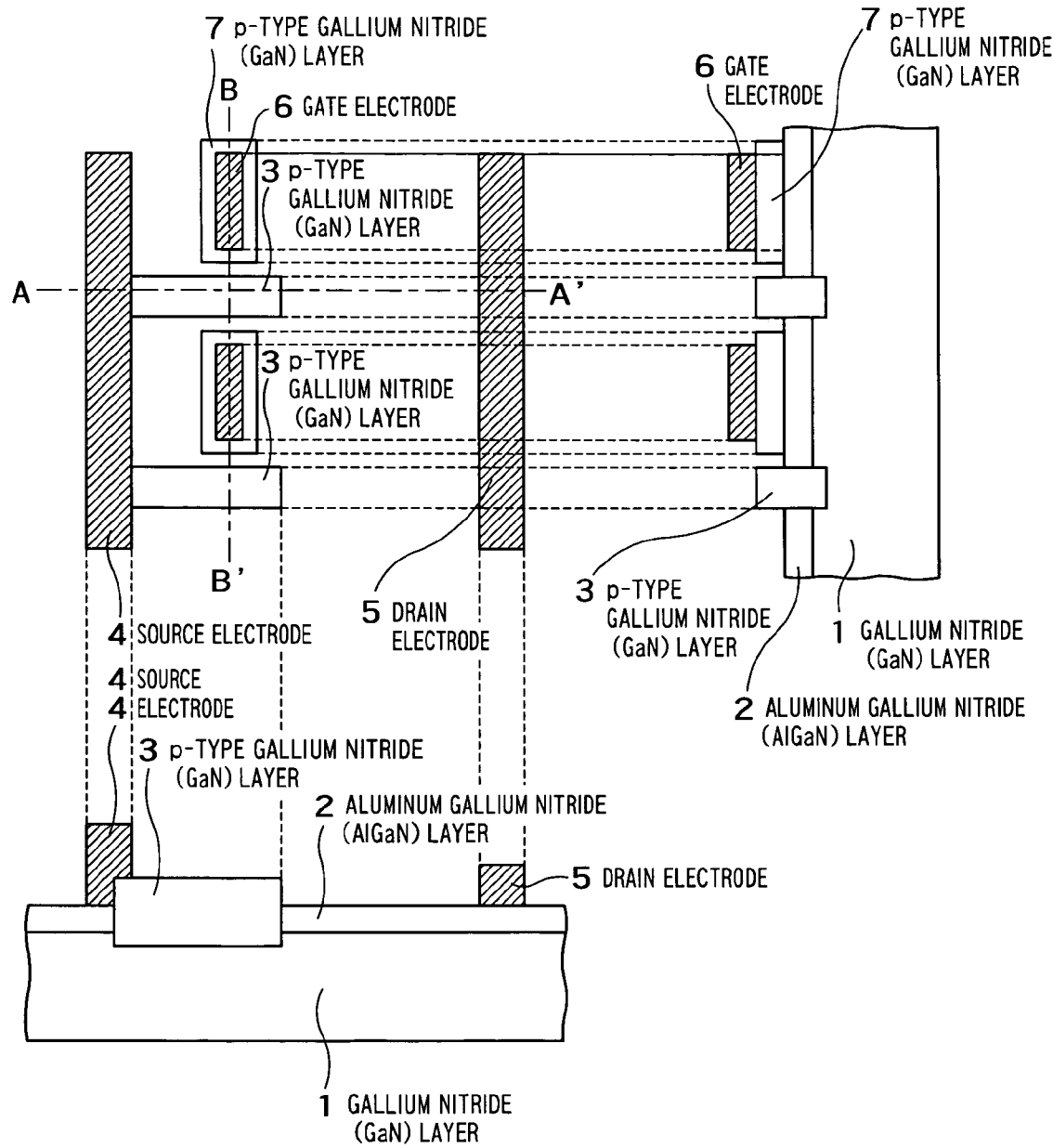
FIG. 16A is a plan view typically showing the configuration of a nitride power semiconductor device according to a thirteenth embodiment of the present invention.
FIGS. 16B and 16C are sectional views typically showing the configuration of the same.

FIG. 16A is a plan view typically showing the configuration of a nitride power semiconductor device according to the thirteenth embodiment of the present invention. FIGS. 16B and 16C are sectional views typically showing the configuration of the same. FIGS. 16B and 16C show sectional structures along lines A-A' and B-B' shown in FIG. 16A, respectively.

The nitride power semiconductor device according to the thirteenth embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, p-type gallium nitride (GaN) layers 3 formed in stripe-shaped recess portions formed in substantially parallel to each other at predetermined intervals in a depth corresponding to a level difference between the surface of the n-type aluminum gallium nitride (AlGaN) layer 2 and the surface portion of the gallium nitride (GaN) layer 1 in a predetermined region of the n-type aluminum gallium nitride (AlGaN) layer 2 to project over the n-type aluminum gallium nitride (AlGaN) layer 2, a source electrode 4 formed on the n-type aluminum gallium nitride (AlGaN) layer 2 to be electrically connected to one ends of the p-type gallium nitride (GaN) layers 3, a drain electrode 5 formed on the n-type aluminum gallium nitride (AlGaN) layer 2 and spaced apart from the other ends of the p-type gallium nitride (GaN) layers 3, a p-type gallium nitride (GaN) layer 7 formed on the n-type aluminum gallium nitride (AlGaN) layer 2 between the source electrode 4 and the drain electrode 5 in the side of the source electrode 4 with respect to the other ends of the p-type gallium nitride (GaN) layers 3, and a gate electrode 6 formed on the p-type gallium nitride (GaN) layer 7.

The nitride power semiconductor device according to the thirteenth embodiment of the present invention, like the nitride power semiconductor device according to the second embodiment of the present invention shown in FIGS. 2A to 2C, has a normally-off type HEMT structure in which the p-type gallium nitride (GaN) layer 7 is formed immediately under the gate electrode 6.

On the other hand, the structure of the p-type gallium nitride (GaN) layers 3 and a periphery thereof is the same structure as that of the nitride power semiconductor device according to the tenth embodiment of the present invention shown in FIGS. 13A to 13C.

In the nitride power semiconductor device according to the thirteenth embodiment of the present invention having the normally-off type HEMT structure, not only the same effect as that of the nitride power semiconductor device according to the second embodiment of the present invention, but also the same effect as that of the nitride power semiconductor device according to the tenth embodiment of the present invention can be achieved.

FIG. 17A is a plan view typically showing the configuration of a nitride power semiconductor device according to the fourteenth embodiment of the present invention. FIGS. 17B and 17C are sectional views typically showing the configuration of the same. FIGS. 17B and 17C show sectional structures along lines A-A' and B-B' shown in FIG. 17A, respectively.

The nitride power semiconductor device according to the fourteenth embodiment of the present invention includes a undoped gallium nitride (GaN) layer 1 formed as a channel layer, an n-type aluminum gallium nitride (AlGaN) layer 2 formed as a barrier layer on the gallium nitride (GaN) layer 1, p-type gallium nitride (GaN) layers 3 formed in stripe-shaped recess portions formed in substantially parallel to each other at predetermined intervals in a depth corresponding to a level difference between the surface of the n-type aluminum gallium nitride (AlGaN) layer 2 and the surface portion of the gallium nitride (GaN) layer 1 in a predetermined region of the n-type aluminum gallium nitride (AlGaN) layer 2 to project over the n-type aluminum gallium nitride (AlGaN) layer 2, a source electrode 4 formed on the n-type aluminum gallium nitride (AlGaN) layer 2 to be electrically connected to one ends of the p-type gallium nitride (GaN) layers 3, a drain electrode 5 formed on the n-type aluminum gallium nitride (AlGaN) layer 2 and spaced apart from the other ends of the p-type gallium nitride (GaN) layers 3, a p-type gallium nitride (GaN) layer 7 formed on the n-type aluminum gallium nitride (AlGaN) layer 2 between the source electrode 4 and the drain electrode 5 in the side of the source electrode 4 with respect to the other ends of the p-type gallium nitride (GaN) layers 3, a gate insulating film 11 formed to cover the n-type aluminum gallium nitride (AlGaN) layer 2, the p-type gallium nitride (GaN) layers 3 and the p-type gallium nitride (GaN) layer 7 between the source electrode 4 and the drain electrode 5, and a gate electrode 6 formed on the gate insulating film 11 in a region above the p-type gallium nitride (GaN) layer 7.

The nitride power semiconductor device according to the fourteenth embodiment of the present invention, like the nitride power semiconductor device according to the sixth embodiment of the present invention shown in FIGS. 7a to 7C, is a normally-off type horizontal gallium-nitride based field effect transistor having a MIS gate structure (MIS-HFET) which includes an aluminum gallium nitride/gallium nitride (AlGaN/GaN) heterostructure, in which the gate insulating film 11 is formed between the gate electrode 6 and the n-type aluminum gallium nitride (AlGaN) layer 2, and in which the p-type gallium nitride (GaN) layer 7 is formed between the gate insulating film 11 immediately under the gate electrode 6 and the n-type aluminum gallium nitride (AlGaN) layer 2.

The structure of the p-type gallium nitride (GaN) layers 3 and a periphery thereof is the same structure as that of the nitride power semiconductor device according to the tenth embodiment of the present invention shown in FIGS. 13A to 13C.

In the nitride power semiconductor device according to the fourteenth embodiment of the present invention having the normally-off type MIS gate structure, not only the same effect as that of the nitride power semiconductor device according to the sixth embodiment of the present invention, but also the same effect as that of the nitride power semiconductor device according to the tenth embodiment of the present invention can be achieved.

Figure 18A:
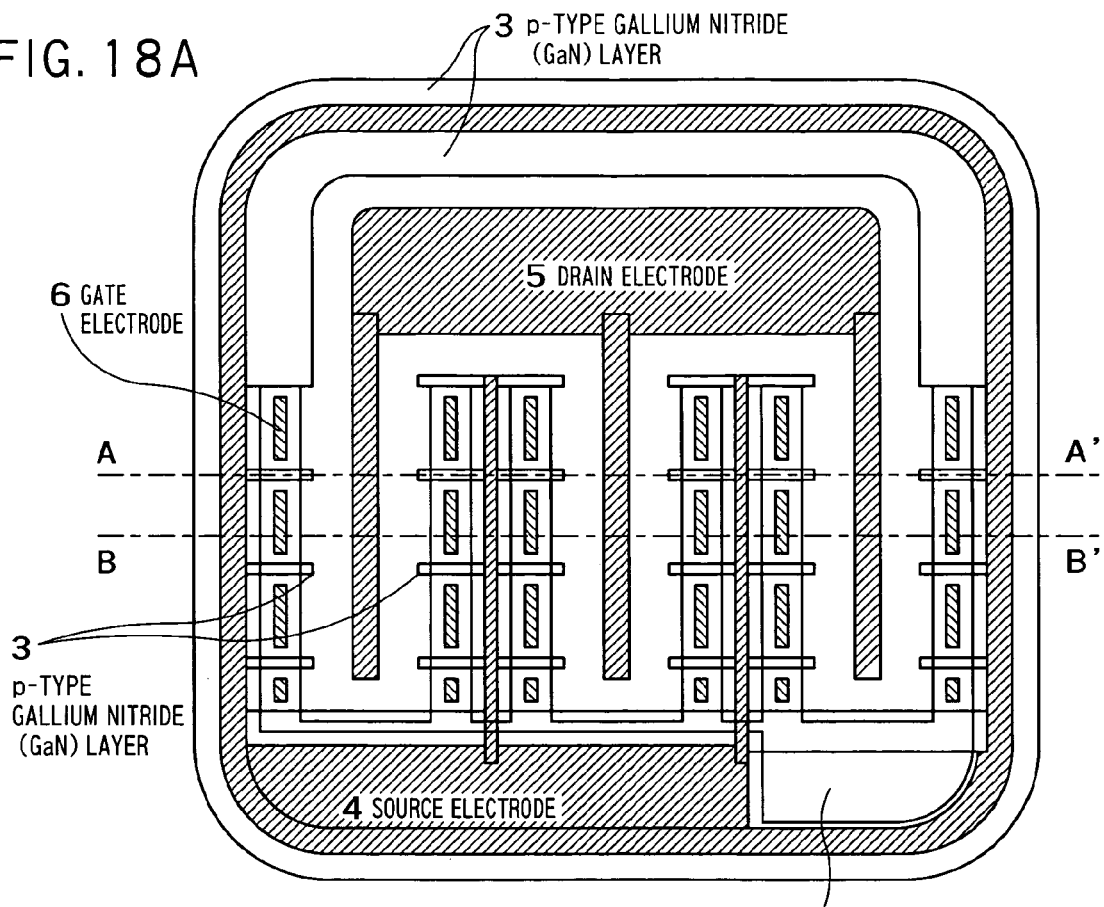
FIG. 18A is a plan view typically showing the configuration of a nitride power semiconductor device according to a fifteenth embodiment of the present invention.
Figure 18B:
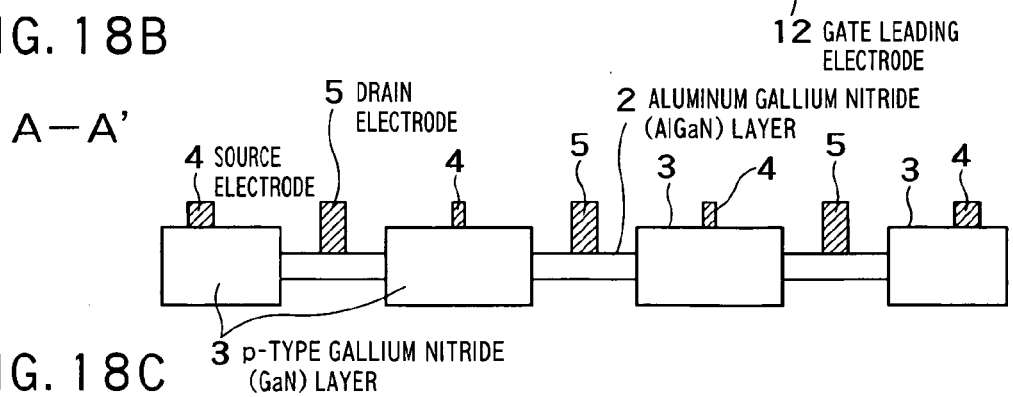
FIGS. 18B and 18C are sectional views typically showing the configuration of the same.
Figure 18C:
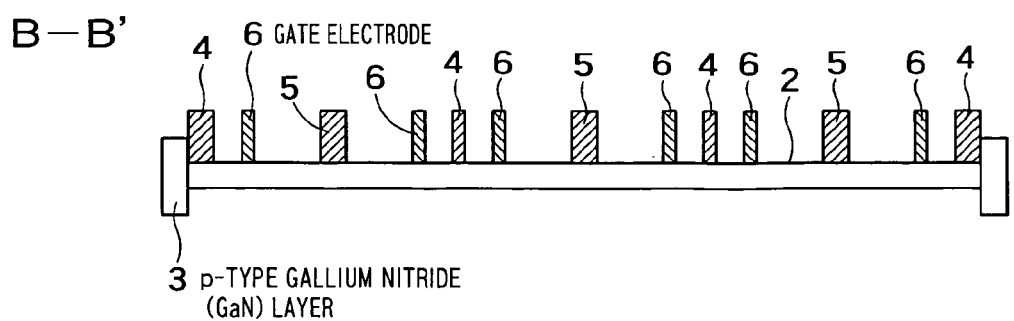

FIG. 18A is a plan view typically showing the configuration of a nitride power semiconductor device according to the fifteenth embodiment of the present invention. FIGS. 18B and 18C are sectional views typically showing the configuration of the same. FIGS. 18B and 18C show sectional structures along lines A-A' and B-B' shown in FIG. 18A, respectively.

The nitride power semiconductor device according to the fifteenth embodiment of the present invention relates a planar configuration of an entire device block which can be applied to the nitride power semiconductor device according to the tenth embodiment of the present invention shown in FIGS. 13A to 13C.

As shown in FIG. 18, the planar configuration of the device block of the nitride power semiconductor device according to the fifteenth embodiment of the present invention is the same as the planar configuration of the device block of the nitride power semiconductor device according to the seventh embodiment of the present invention shown in FIG. 8.

On the other hand, the sectional structure of the device block of the nitride power semiconductor device according to the fifteenth embodiment of the present invention is the same as the sectional structure of the nitride power semiconductor device according to the tenth embodiment of the present invention shown in FIGS. 13A to 13C. Therefore, the sectional structure is different from the sectional structures of the nitride power semiconductor devices according to the first to sixth embodiments of the present invention corresponding to the nitride power semiconductor device according to the seventh embodiment of the present invention.

In the nitride power semiconductor device according to the fifteenth embodiment of the present invention, as in the nitride power semiconductor device according to the seventh embodiment of the present invention, a device isolation region which surrounds the periphery portion of the device block including a plurality of devices to insulatively isolate the device block from the outside thereof is formed by the p-type gallium nitride (GaN) layers 3.

The device block peripheral portion is surrounded by the p-type gallium nitride (GaN) layers 3 to make it possible to obtain the same effect as that obtained by pn isolation. Accordingly, pattern formation for the p-type gallium nitride (GaN) layers 3 and a device isolation process can be simultaneously performed.

More specifically, even in the nitride power semiconductor device according to the fifteenth embodiment of the present invention having the same sectional structure as that of the nitride power semiconductor device according to the tenth embodiment of the present invention, the same effect as that obtained by the nitride power semiconductor device according to the seventh embodiment of the present invention can be achieved.

FIG. 19A is a plan view typically showing the configuration of a nitride power semiconductor device according to the sixteenth embodiment of the present invention. FIGS. 19B and 19C are sectional views typically showing the configuration of the same. FIGS. 19B and 19C show sectional structures along lines A-A' and B-B' shown in FIG. 19A, respectively.

The nitride power semiconductor device according to the sixteenth embodiment of the present invention, like the nitride power semiconductor device according to the fifteenth embodiment of the present invention, relates to the planar configuration of an entire device block which can be applied to the nitride power semiconductor device according to the tenth embodiment of the present invention shown in FIGS. 13A to 13C. The nitride power semiconductor device according to the sixteenth embodiment of the present invention is a modification obtained by partially changing the configuration of the nitride power semiconductor device according to the fifteenth embodiment of the present invention.

The relationship between the nitride power semiconductor device according to the sixteenth embodiment of the present invention and the nitride power semiconductor device according to the fifteenth embodiment of the present invention corresponds to the relationship between the nitride power semiconductor device according to the seventh embodiment of the present invention and the nitride power semiconductor device according to the eighth embodiment of the present invention.

In the nitride power semiconductor device according to the sixteenth embodiment of the present invention, as shown in FIGS. 19A to 19C, a distance L1 between the leading drain electrode wiring of the drain electrode 5 out of the device region and the outer device region p-type gallium nitride (GaN) layers 3 is set to be smaller than a distance L2 between the device region drain electrode wiring of the drain electrode 5 in the device region and the outer device region p-type gallium nitride (GaN) layers 3.

In this manner, the length between the p-type gallium nitride (GaN) layers 3 and the drain electrode 5 is changed depending on the regions in the device block, for example, as in the example shown in FIGS. 19A to 19C, the distance L1 and L2 are set to satisfy an inequality: L1<L2, thereby leading a portion where avalanche breakdown occurs to a predetermined region. Specifically, if avalanche breakdown occurs, the avalanche breakdown can be caused out of the device region but in the device region.

Therefore, even in the nitride power semiconductor device according to the sixteenth embodiment of the present invention, as in the nitride power semiconductor device according to the eighth embodiment of the present invention, the device region can be reliably prevented from being broken by avalanche breakdown, and an avalanche current can be avoided from flowing into the gate driver circuit even if avalanche breakdown occurs.

The configuration which completely corresponds to the planar configurations of the nitride power semiconductor devices according to the fifteenth and sixteenth embodiments of the present invention shown in FIGS. 18A to 18C and FIGS. 19A to 19C is the configuration of the nitride power semiconductor device according to the tenth embodiment of the present invention shown in FIGS. 13A to 13C. However, the planar configurations of the nitride power semiconductor devices according to the fifteenth and sixteenth embodiments of the present invention can also be applied to the nitride power semiconductor devices according to the eleventh to fourteenth embodiments of the present invention shown in FIGS. 14 to 17, i.e., a normally-off type structure device and a MIS gate structure device.

As described above, in the nitride power semiconductor devices according to each embodiment of the present invention, the p-type gallium nitride (GaN) layers 3 electrically connected to the source electrode 4 and extending and projecting to the side of the drain electrode 5 with respect to the gate electrode 6 are formed. Accordingly, even though avalanche breakdown occurs, generated holes are rapidly discharged to the source electrode 4 through the p-type gallium nitride (GaN) layers 3. Therefore, the holes are not accumulated in the gallium nitride (GaN) layer 1 serving as a channel layer, and a high avalanche withstanding capability can be realized.

As a result, a high-breakdown voltage nitride power semiconductor device having a high avalanche withstanding capability and a super low ON-resistance can be provided.

In the above description, the present invention has been explained with reference to the first to sixteenth embodiments of the present invention. However, the present invention is not limited to the embodiments, and the present invention can also be easily applied to all modifications which can be easily conceived by a person skilled in the art.

For example, the p-type gallium nitride (GaN) layers 3 preferably has a bandgap smaller than that of the n-type aluminum gallium nitride (AlGaN) layer 2, i.e., a composition rate of aluminum (Al) smaller than that of the n-type aluminum gallium nitride (AlGaN) layer 2 from the viewpoint of hole discharging.

The n-type aluminum gallium nitride (AlGaN) layer 2 can also be formed as a p-type aluminum gallium nitride (AlGaN) layer but an n-type layer. In order to decrease a contact resistance, a semiconductor layer such as an indium gallium nitride (InGaN) layer having a narrow bandgap may also be used, and an indium gallium nitride (InGaN) layer can also be inserted as a contact layer.

Furthermore, when the field plate structures shown in FIGS. 5 and 6 are applied to the structures shown in FIGS. 7 to 19, a high breakdown voltage can be achieved.

In the nitride power semiconductor devices according to the embodiments of the present invention, the semiconductor device including an aluminum gallium nitride/gallium nitride (AlGaN/GaN) heterostructure has been described. However, the configurations of the present invention can also be applied to a semiconductor device including a gallium nitride/indium gallium nitride (GaN/InGaN) structure or an aluminum nitride/aluminum gallium nitride (AlN/AlGaN) structure.

Although a substrate material for forming the aluminum gallium nitride/gallium nitride (AlGaN/GaN) structure is not especially described. However, the present invention can be achieved regardless of characteristics of the substrate such as conductivity or insulative properties and independently of a substrate material such as a sapphire substrate, a silicon carbide (SiC) substrate, or a silicon (Si) substrate and the like.

As described above, the nitride power semiconductor devices according to each embodiment of the present invention can provide a nitride power semiconductor device having a high avalanche withstanding capability and a super low ON-resistance.

What is claimed is:

1. A nitride semiconductor device comprising:
    an undoped first aluminum gallium nitride ($Al_xGa_{1-x}N$ ($0 \leq x \leq 1$)) layer as a channel layer;
    an undoped or n-type second aluminum gallium nitride ($Al_yGa_{1-y}N$ ($0 \leq y \leq 1$, x<y)) layer formed as a barrier layer on the first aluminum gallium nitride layer;
    a p-type third aluminum gallium nitride ($Al_zGa_{1-z}N$ ($0 \leq z \leq 1$)) layer having stripe-shaped portions formed at predetermined intervals in a predetermined region on the second aluminum gallium nitride layer;
    a source electrode formed on the second aluminum gallium nitride layer to electrically connected to one ends of the stripe-shaped portions of the third aluminum gallium nitride layer;

a drain electrode formed on the second aluminum gallium nitride layer to be spaced apart form the other ends of the stripe-shaped portions of the third aluminum gallium nitride layer; and a gate electrode formed on the second aluminum gallium nitride layer between the source electrode and the drain electrode in a side of the source electrode with respect to the other ends of the stripe-shaped portions of the third aluminum gallium nitride layer, and formed between the stripe-shaped portions of the third aluminum gallium nitride layer separately from the stripe-shaped portions of the third aluminum gallium nitride layer.

2. The nitride semiconductor device according to claim 1, further comprising a p-type fourth aluminum gallium nitride ($Al_zGa_{1-z}N$ ($0 \leq z \leq 1$)) layer formed between the second aluminum gallium nitride layer and the gate electrode.

3. The nitride semiconductor device according to claim 2, wherein an interval d between the third aluminum gallium nitride layer and the fourth aluminum gallium nitride layer is shorter than a length L of the fourth aluminum gallium nitride layer in a direction extending from the source electrode to the drain electrode (d<L).

4. The nitride semiconductor device according to claim 2, further comprising a gate insulating film formed between the fourth aluminum gallium nitride layer and the gate electrode.

5. The nitride semiconductor device according to claim 1, further comprising:
an insulating film formed to cover the gate electrode and the third aluminum gallium layer; and
a field plate electrode formed on the insulating film to cover the gate electrode and the third aluminum gallium nitride layer and electrically connected to the source electrode.

6. The nitride semiconductor device according to claim 5, further comprising a second field plate electrode formed on the insulating film to cover a region near the drain electrode and electrically connected to the drain electrode.

7. The nitride semiconductor device according to claim 1, further comprising a gate insulating film formed between the second aluminum gallium nitride layer and the gate electrode.

8. The nitride semiconductor device according to claim 1, further comprising a gate insulating film formed between the third aluminum gallium nitride layer and the gate electrode.

9. The nitride semiconductor device according to claim 2, wherein
the source electrode is a part of a source electrode having a device region source electrode wiring extending in a device region of a device block including a plurality of devices, a peripheral source electrode wiring formed around a peripheral portion of the device block, and a leading source electrode wiring used to connect the device region source electrode wiring and the peripheral source electrode wiring to an external circuit,
the drain electrode is a part of a drain electrode having a device region drain electrode wiring extending in the device region of the device block and a leading drain electrode wiring used to connect the device region drain electrode wiring and an external circuit,
the third aluminum gallium nitride layer is a part of a p-type aluminum gallium nitride layer having device region aluminum gallium nitride layers formed in stripe-shape and in substantially parallel to each other at predetermined intervals to extend from the device region source electrode wiring to the device region drain electrode wiring such that one ends are electrically connected to the device region source electrode wiring and the other ends are spaced apart from the device region drain electrode wiring, an outer device region aluminum gallium nitride layer formed between the peripheral source electrode wiring and the leading drain electrode wiring to be electrically connected to the peripheral source electrode wiring and spaced apart from the leading drain electrode wiring, and a device isolation region aluminum gallium nitride layer formed in a device isolation region to surround the peripheral source electrode wiring and insulatively isolate the device block from outside thereof, and
the gate electrode is a gate electrode formed between the device region source electrode wiring and the device region drain electrode wiring in a side of the device region source electrode wiring with respect to the ends of the device region aluminum gallium nitride layer of the device region drain electrode wiring side.

10. The nitride semiconductor device according to claim 9, wherein a distance L1 between the leading drain electrode wiring out of the device region and the outer device region aluminum gallium nitride layer is smaller than a distance L2 between the device region drain electrode wiring in the device region and the outer device region aluminum gallium nitride layer.

11. The nitride semiconductor device according to claim 7, wherein
the third aluminum gallium nitride layer has a projecting portion projecting in a direction crossing a longitudinal direction of the stripe-shaped portions at a predetermined position, and
the gate electrode is formed on the gate insulating film such that a part of the gate electrode overlaps the projecting portions of the third aluminum gallium nitride layer via the gate insulating film.

12. The nitride semiconductor device according to claim 11, wherein an interval W between one of the projecting portions of the third aluminum gallium nitride layer which overlaps one end of the gate electrode via the gate insulating film and the other projecting portions of the third aluminum gallium nitride layer which overlaps the other ends of the gate electrode via the gate insulating film is smaller than a dimension L of the projecting portions in the longitudinal direction of the stripe-shaped portions of the third aluminum gallium nitride layer.

13. The nitride semiconductor device according to claim 11, wherein an interval Wb between the stripe-shaped portions of the third aluminum gallium nitride layer is smaller than a distance Lb between the end of the gate electrode of the drain electrode side and the other ends of the stripe-shaped portions of the third aluminum gallium nitride layer.

* * * * *